(12) United States Patent
Nosaka

(10) Patent No.: US 10,567,031 B2
(45) Date of Patent: Feb. 18, 2020

(54) RADIO-FREQUENCY FILTER DEVICE AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/199,573

(22) Filed: Nov. 26, 2018

(65) Prior Publication Data

US 2019/0097672 A1 Mar. 28, 2019

Related U.S. Application Data

(63) Continuation of application No. PCT/JP2017/019790, filed on May 26, 2017.

(30) Foreign Application Priority Data

May 27, 2016 (JP) .................................. 2016-106768

(51) Int. Cl.
*H04B 1/44* (2006.01)
*H03H 9/72* (2006.01)
(Continued)

(52) U.S. Cl.
CPC .............. *H04B 1/44* (2013.01); *H03H 7/0115* (2013.01); *H03H 7/38* (2013.01); *H03H 9/0576* (2013.01);
(Continued)

(58) Field of Classification Search
CPC .. H03H 2007/386; H03H 7/0115; H03H 7/38; H03H 9/0576; H03H 9/6403;
(Continued)

(56) References Cited

U.S. PATENT DOCUMENTS 5,375,256 A * 12/1994 Yokoyama ............. H01Q 1/244
333/129
5,881,369 A * 3/1999 Dean ....................... H04B 1/005
455/266

(Continued)

FOREIGN PATENT DOCUMENTS

JP     H06-318836 A    11/1994
JP     2008-306359 A   12/2008
(Continued)

OTHER PUBLICATIONS

International Search Report for International Application No. PCT/JP2017/019790, dated Aug. 1, 2017.
(Continued)

*Primary Examiner* — Tan H Trinh
(74) *Attorney, Agent, or Firm* — Pearne & Gordon LLP

(57) ABSTRACT

A filter module (20) includes a filter circuit (22) that includes switches (221SW and 224SW), a pass band of the filter circuit (22) being switched in accordance with switching between ON and OFF of the switches (221SW and 224SW); and an impedance matching circuit (21) that is disposed in at least one of a preceding stage and a subsequent stage of the filter circuit (22) and that includes a switch (212SW), an element value for achieving impedance matching being switched in the impedance matching circuit (21) in accordance with switching between ON and OFF of the switch (212SW). The switches (221SW and 224SW) and the switch (212SW) synchronize with each other regarding timing of switching between ON and OFF.

15 Claims, 15 Drawing Sheets

(51) Int. Cl.
*H04B 1/04* (2006.01)
*H04B 1/18* (2006.01)
*H04B 1/00* (2006.01)
*H03H 9/05* (2006.01)
*H03H 7/01* (2006.01)
*H03H 7/38* (2006.01)

(52) U.S. Cl.
CPC .......... *H03H 9/725* (2013.01); *H04B 1/0057* (2013.01); *H04B 1/0458* (2013.01); *H04B 1/18* (2013.01); *H03H 2007/386* (2013.01)

(58) Field of Classification Search
CPC .... H03H 9/6483; H03H 9/725; H04B 1/0057; H04B 1/0458; H04B 1/18; H04B 1/44; H04B 1/50; H04B 1/58
USPC ..... 455/83, 84, 266; 370/277, 280; 333/101, 333/124, 129, 195
See application file for complete search history.

(56) References Cited

U.S. PATENT DOCUMENTS

| | | | |
|---|---|---|---|
| 6,545,564 B1* | 4/2003 | Coppola | H03H 7/48 333/124 |
| 9,851,384 B2* | 12/2017 | van Bezooijen | H03H 7/40 |
| 2005/0093645 A1* | 5/2005 | Watanabe | H03H 7/383 333/101 |
| 2009/0011720 A1* | 1/2009 | Hosokawa | H03D 7/12 455/84 |
| 2009/0201104 A1 | 8/2009 | Ueda et al. | |
| 2011/0199168 A1 | 8/2011 | Kadota | |
| 2012/0274421 A1* | 11/2012 | Hara | H03H 7/38 333/195 |
| 2013/0169333 A1* | 7/2013 | Oshima | H03H 11/16 327/237 |
| 2013/0201882 A1* | 8/2013 | Bauder | H03H 7/48 370/277 |
| 2015/0318890 A1* | 11/2015 | Uejima | H04B 1/18 455/83 |
| 2016/0134414 A1* | 5/2016 | Pehlke | H04B 1/0057 370/280 |
| 2016/0226536 A1* | 8/2016 | Park | H03H 7/0153 |
| 2016/0285482 A1 | 9/2016 | Wada | |
| 2017/0048859 A1* | 2/2017 | Hayakawa | H01Q 1/48 |
| 2017/0346452 A1* | 11/2017 | Wada | H03H 7/075 |
| 2018/0343000 A1* | 11/2018 | Nosaka | H04B 1/00 |
| 2019/0097605 A1* | 3/2019 | Nosaka | H03H 9/542 |
| 2019/0181838 A1* | 6/2019 | Nosaka | H03H 7/46 |

FOREIGN PATENT DOCUMENTS

| | | |
|---|---|---|
| JP | 2009-207116 A | 9/2009 |
| JP | 2011-114826 A | 6/2011 |
| JP | 2013-066250 A | 4/2013 |
| JP | 2014-003460 A | 1/2014 |
| WO | 2015/093462 A1 | 6/2015 |

OTHER PUBLICATIONS

Written Opinion for International Application No. PCT/JP2017/019790, dated Aug. 1, 2017.

* cited by examiner

FIG. 10A

| CONTROL SIGNAL ($\phi$ctrl) | SWITCH OF IMPEDANCE MATCHING CIRCUIT | SWITCH OF FILTER CIRCUIT |
|---|---|---|
| High | On | On |
| Low | Off | Off |

FIG. 10B

| CONTROL SIGNAL ($\phi$ctrl) | SWITCH OF IMPEDANCE MATCHING CIRCUIT | SWITCH OF FILTER CIRCUIT |
|---|---|---|
| High | On | Off |
| Low | Off | On |

RADIO-FREQUENCY FILTER DEVICE AND COMMUNICATION APPARATUS

This is a continuation of International Application No. PCT/JP2017/019790 filed on May 26, 2017 which claims priority from Japanese Patent Application No. 2016-106768 filed on May 27, 2016. The contents of these applications are incorporated herein by reference in their entireties.

BACKGROUND OF THE DISCLOSURE

Field of the Disclosure

The present disclosure relates to a radio-frequency filter device and a communication apparatus.

Description of the Related Art

Hitherto, tunable filters (frequency variable filters) whose pass bands are variable have been developed to support combined functions such as multi-modes and multi-bands of mobile communication apparatuses.

As such a tunable filter, for example, there has been known a configuration for changing a frequency at a singular point by using a variable capacitor in a ladder filter structure using a resonator that has a singular point (resonant point) at which impedance is minimum (ideally 0) and a singular point (anti-resonant point) at which impedance is maximum (ideally infinite) (see, for example, Patent Document 1).

Also, for example, there has been known a configuration in which, in a filter circuit including a plurality of LC parallel resonant circuits, a diode or a field effect transistor (FET) is connected in parallel to at least one of the LC parallel resonant circuits, and a diode or a FET is connected in series to at least another one of the LC parallel resonant circuits (see, for example, Patent Document 2). With this configuration, the frequencies of a pass band or the frequency of at least one attenuation pole can be changed by controlling a bias voltage applied to the diode or the FET.
Patent Document 1: Japanese Unexamined Patent Application Publication NO. 2013-66250
Patent Document 2: Japanese Unexamined Patent Application Publication NO. 6-318836

BRIEF SUMMARY OF THE DISCLOSURE

In such a tunable filter, if the frequencies of a pass band or the frequency of at least one attenuation pole is changed, characteristic impedance may be changed by a change in electrical characteristics in the tunable filter. Accordingly, insertion loss within the pass band may increase (the loss may become greater).

The present disclosure has been made to solve the foregoing problems and an object of the present disclosure is to provide a radio-frequency filter device and a communication apparatus that are able to switch the frequencies of a pass band or the frequency of at least one attenuation pole while suppressing an increase in insertion loss within the pass band.

To achieve the foregoing object, a radio-frequency filter device according to an aspect of the present disclosure includes a radio-frequency filter circuit that includes a first switch element, a pass band of the radio-frequency filter circuit being switched in accordance with switching between ON and OFF of the first switch element; and an impedance matching circuit that is disposed in at least one of a preceding stage and a subsequent stage of the radio-frequency filter circuit and that includes a second switch element, an element value for achieving impedance matching being switched in the impedance matching circuit in accordance with switching between ON and OFF of the second switch element. The first switch element and the second switch element synchronize with each other regarding timing of switching between ON and OFF.

Accordingly, when switching between ON and OFF of the first switch element is performed to switch the frequencies of the pass band or the frequency of at least one attenuation pole, the element value of the impedance matching circuit is switched by the second switch element that synchronizes with the first switch element regarding the switching between ON and OFF. Thus, even if the impedance of the radio-frequency filter circuit is changed in accordance with the switching of the frequencies of the pass band or the frequency of at least one attenuation pole, the impedance matching circuit is able to achieve impedance matching between the changed impedance of the radio-frequency filter circuit and the predetermined impedance. Thus, it is possible to switch the frequencies of the pass band or the frequency of at least one attenuation pole while suppressing an increased in insertion loss within the pass band.

The radio-frequency filter device may further include a control line that is provided in common for the radio-frequency filter circuit and the impedance matching circuit and that transmits a control signal for switching between ON and OFF of the first and second switch elements.

With this configuration in which the control line is provided in common for the radio-frequency filter circuit and the impedance matching circuit, the circuit configuration is simplified.

Both the first and second switch elements may come into an ON-state or an OFF-state.

In this way, both the first and second switch elements come into an ON-state or an OFF-state, and these switches can be built in the same switch IC.

One of the first and second switch elements may come into an ON-state and another of the first and second switch elements may come into an OFF-state, or the one may come into the OFF-state and the other may come into the ON-state.

The radio-frequency filter circuit may further include a third switch element, the pass band being switched in the radio-frequency filter circuit in accordance with switching between ON and OFF of the third switch element. The impedance matching circuit may further include a fourth switch element, the element value for achieving impedance matching being switched in the impedance matching circuit in accordance with switching between ON and OFF of the fourth switch element. The third switch element and the fourth switch element may synchronize with each other regarding timing of switching between ON and OFF. The timing of switching between ON and OFF of the first and second switch elements and the timing of switching between ON and OFF of the third and fourth switch elements may be independent of each other.

Accordingly, the bandpass characteristic of the radio-frequency filter circuit can be more finely adjusted by appropriately selecting ON and OFF of the first switch element and the third switch element, and impedance matching can be achieved by appropriately selecting ON and OFF of the second switch element and the fourth switch element.

The impedance matching circuit may be connected to a common connection point to which the radio-frequency filter circuit and another radio-frequency filter circuit are connected.

Accordingly, the impedance matching circuit can be shared by a plurality of radio-frequency filter circuits, and thus the size and cost of the radio-frequency filter device can be reduced.

The radio-frequency filter circuit may include a series-arm circuit connected between a first input/output terminal and a second input/output terminal, and a parallel-arm circuit connected to a node on a path that connects the first input/output terminal and the second input/output terminal and to a ground. The parallel-arm circuit may include a first circuit including a first parallel-arm resonator, and a second circuit connected in parallel to the first circuit and including a second parallel-arm resonator. At least one circuit among the first circuit and the second circuit may further include a frequency variable circuit that is connected in series to the first parallel-arm resonator or the second parallel-arm resonator in the one circuit and that includes an impedance element and the first switch element connected in parallel to each other. The second parallel-arm resonator may have a resonant frequency different from a resonant frequency of the first parallel-arm resonator, and an anti-resonant frequency different from an anti-resonant frequency of the first parallel-arm resonator.

Regarding this, in the radio-frequency filter circuit, an attenuation pole on the low band side of the pass band is formed by a resonant frequency on the low frequency side of the parallel-arm circuit, an attenuation pole on the high band side of the pass band is formed by a resonant frequency on the high frequency side of the parallel-arm circuit, and a pass band is formed by an anti-resonant frequency on the low frequency side of the parallel-arm circuit and the series-arm circuit.

According to this aspect, with the configuration of the parallel-arm circuit, at least one resonant frequency among at least two resonant frequencies in the parallel-arm circuit and at least one anti-resonant frequency among at least two anti-resonant frequencies can be shifted to the low frequency side or high frequency side by switching between ON and OFF of the first switch element. Accordingly, the frequency at the end of the pass band and the frequency at the attenuation pole can be shifted to the low frequency side or high frequency side. Thus, according to this aspect, it is possible to switch the frequencies of the pass band or the frequency of at least one attenuation pole while suppressing an increase in loss at the frequency at the end of the pass band.

The resonant frequency of the first parallel-arm resonator may be lower than the resonant frequency of the second parallel-arm resonator. The anti-resonant frequency of the first parallel-arm resonator may be lower than the anti-resonant frequency of the second parallel-arm resonator. The first circuit may not include the frequency variable circuit, whereas the second circuit may include the frequency variable circuit.

Accordingly, the resonant frequency on the high frequency side among the at least two resonant frequencies in the parallel-arm circuit and the anti-resonant frequency on the low frequency side among the at least two anti-resonant frequencies can be shifted to the low frequency side or high frequency side by switching between ON and OFF of the first switch element. Thus, the frequency at the higher end of the pass band and the frequency of the attenuation pole on the high band side of the pass band can be shifted to the low frequency side or high frequency side. Thus, according to this aspect, it is possible to switch the frequency at the higher end of the pass band and the frequency of the attenuation pole on the high band side of the pass band while suppressing an increase in insertion loss at the higher end of the pass band.

The resonant frequency of the first parallel-arm resonator may be lower than the resonant frequency of the second parallel-arm resonator. The anti-resonant frequency of the first parallel-arm resonator may be lower than the anti-resonant frequency of the second parallel-arm resonator. The first circuit may include the frequency variable circuit, whereas the second circuit may not include the frequency variable circuit.

Accordingly, the resonant frequency on the low frequency side among the at least two resonant frequencies in the parallel-arm circuit and the anti-resonant frequency on the low frequency side among the at least two anti-resonant frequencies can be shifted to the low frequency side or high frequency side by switching between ON and OFF of the first switch element. Thus, the frequency at the lower end of the pass band and the frequency of the attenuation pole on the low band side of the pass band can be shifted to the low frequency side or high frequency side. Thus, according to this aspect, it is possible to switch the frequency at the lower end of the pass band and the frequency of the attenuation pole on the low band side of the pass band while suppressing an increase in insertion loss at the lower end of the pass band.

The resonant frequency of the first parallel-arm resonator may be lower than the resonant frequency of the second parallel-arm resonator. The anti-resonant frequency of the first parallel-arm resonator may be lower than the anti-resonant frequency of the second parallel-arm resonator. Each of the first circuit and the second circuit may include the frequency variable circuit.

Accordingly, the frequency at the higher end of the pass band and the attenuation pole on the high band side of the pass band can be switched by switching between ON and OFF of the first switch element in the second circuit, and the frequency at the lower end of the pass band and the attenuation pole on the low band side of the pass band can be switched by switching between ON and OFF of the first switch element in the first circuit. Thus, according to this aspect, it is possible to switch the frequency at the lower end of the pass band and the frequency of the attenuation pole on the low band side of the pass band, and the frequency at the higher end of the pass band and the frequency of the attenuation pole on the high band side of the pass band, while suppressing an increases in insertion loss at the end of the pass band.

The radio-frequency filter device may include a series-arm circuit connected between a first input/output terminal and a second input/output terminal; and a parallel-arm circuit connected to a node on a path that connects the first input/output terminal and the second input/output terminal and to a ground. The parallel-arm circuit may include a parallel-arm resonator and an impedance circuit connected in series to the parallel-arm resonator. The impedance circuit may include a first impedance element that is one of an inductor and a capacitor, a second impedance element that is another of the inductor and the capacitor, and the first switch element connected in series to the second impedance element. A first series circuit constituted by the second impedance element and the first switch element may be connected in parallel to the first impedance element.

Accordingly, switching between connection and disconnection of the second impedance element is performed in the impedance circuit in accordance with switching between ON and OFF of the first switch element, and thus the impedance of the impedance circuit is switched. In addition, since the first impedance element is one of an inductor and a capacitor, and the second impedance element is the other of the inductor and the capacitor, the impedance circuit has a frequency at which the impedance is maximum due to the inductor and the capacitor when the first switch element is ON. Thus, when the first switch element is ON, the parallel-arm circuit has two resonant frequencies including a resonant frequency lower than the resonant frequency of the parallel-arm resonator.

Thus, in the parallel-arm circuit when the first switch element is ON, the resonant frequency is lower than the resonant frequency of the parallel-arm resonator, and thus sufficient attenuation can be acquired in an attenuation band lower than the resonant frequency of the parallel-arm resonator.

The first impedance element may be the capacitor and the second impedance element may be the inductor.

Accordingly, the impedance circuit when the first switch element is ON is a circuit in which the inductor and the capacitor are connected in parallel to each other, and has an impedance characteristic with a frequency at which the impedance is maximum. Thus, the parallel-arm circuit when the first switch element is ON has two resonant frequencies including a resonant frequency lower than the resonant frequency of the parallel-arm resonator.

On the other hand, the impedance circuit when the first switch element is OFF is a circuit including only a capacitor, and thus has a capacitive impedance. Thus, the parallel-arm circuit when the first switch element is OFF has only one resonant frequency that is higher than the resonant frequency of the parallel-arm resonator and lower than the anti-resonant frequency of the parallel-arm resonator.

Accordingly, the resonant frequency of the parallel-arm resonator and the number of resonant frequencies can be switched in accordance with switching between ON and OFF of the first switch element, and thus the frequency of the attenuation pole and the number of attenuation poles can be switched. Furthermore, when the first switch element is ON, sufficient attenuation can be acquired in an attenuation band lower than the resonant frequency of the parallel-arm resonator.

The first impedance element may be the inductor and the second impedance element may be the capacitor.

Accordingly, the impedance circuit when the first switch element is ON is a circuit in which the inductor and the capacitor are connected in parallel to each other, and has an impedance characteristic with a frequency at which the impedance is maximum. Thus, the parallel-arm circuit when the first switch element is ON has two resonant frequencies including a resonant frequency lower than the resonant frequency of the parallel-arm resonator.

On the other hand, the impedance circuit when the first switch element is OFF is a circuit including only an inductor, and thus has inductive impedance. Thus, the parallel-arm circuit when the first switch element is OFF has two resonant frequencies including a resonant frequency lower than the resonant frequency of the parallel-arm resonator and a resonant frequency higher than the resonant frequency of the parallel-arm resonator.

Accordingly, the frequency of the attenuation pole can be switched in accordance with switching between ON and OFF of the first switch element. Furthermore, when the first switch element is ON, sufficient attenuation can be acquired in an attenuation band lower than the resonant frequency of the parallel-arm resonator.

The radio-frequency filter device may further include a controller that controls ON and OFF of the first switch element and the second switch element.

Accordingly, the radio-frequency filter device supporting multi-bands can be simplified and the size thereof can be reduced.

A communication apparatus according to an aspect of the present disclosure includes a radio-frequency signal processing circuit that processes a radio-frequency signal transmitted or received by an antenna element; and the foregoing radio-frequency filter device that transmits the radio-frequency signal between the antenna element and the radio-frequency signal processing circuit.

Accordingly, the communication apparatus supporting multi-bands can be simplified and the size thereof can be reduced.

In a radio-frequency filter device and so forth according to the present disclosure, it is possible to switch the frequencies of a pass band or the frequency of at least one attenuation pole while suppressing an increase in insertion loss within the pass band.

BRIEF DESCRIPTION OF THE SEVERAL VIEWS OF THE DRAWINGS

FIG. 10A is a diagram illustrating the correspondence between a control signal and the states of switches according to the first embodiment.

FIG. 10B is a diagram illustrating a modification example of the correspondence between a control signal and the states of switches according to the first embodiment.

DETAILED DESCRIPTION OF THE DISCLOSURE

Figure 1:
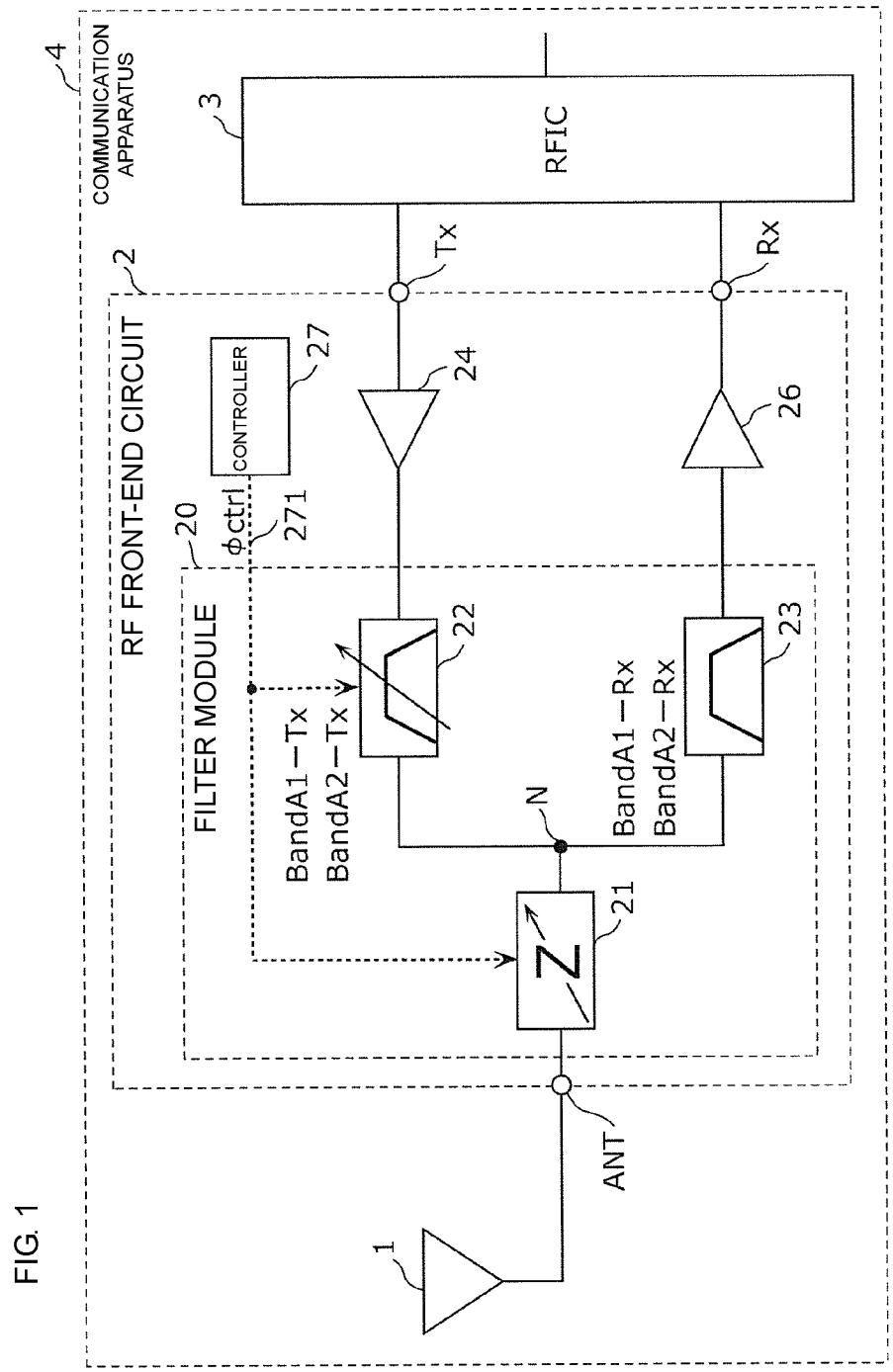
FIG. 1 is a configuration diagram of a communication apparatus according to a first embodiment.

Hereinafter, embodiments of the present disclosure will be described in detail by using the examples and the drawings. Each of the embodiments described below illustrates general or specific examples. The values, shapes, materials, components, arrangement and connection style of the components, and the like described in the following embodiments are merely examples and do not limit the present disclosure. Among the components described in the following embodiments, a component that is not described in an independent claim will be described as an optional component. The sizes of the components illustrated in the drawings or the ratio of the sizes are not always strict. In the individual figures, the components that are substantially the same are denoted by the same numerals, and a duplicate description will be omitted or simplified.

First Embodiment

[1.1 Circuit Configuration of Communication Apparatus]

FIG. 1 is a configuration diagram of a communication apparatus 4 according to a first embodiment. As illustrated in FIG. 1, the communication apparatus 4 includes an antenna element 1, a radio-frequency (RF) front-end circuit 2, and an RF signal processing circuit (RFIC: radio frequency integrated circuit) 3. The communication apparatus 4 is, for example, a cellular phone supporting multi-modes/multi-bands. The antenna element 1, the RF front-end circuit 2, and the RFIC 3 are disposed in, for example, a front-end portion of the cellular phone.

The antenna element 1 is an antenna that transmits and receives RF signals and that supports multi-bands used in LTE, for example. The antenna element 1 need not necessarily support all the bands of the communication apparatus 4, for example, and may support only the bands in a low-frequency band group or a high-frequency band group. In addition, the antenna element 1 need not necessarily be built in the communication apparatus 4.

The RF front-end circuit 2 is a circuit that transmits RF signals between the antenna element 1 and the RFIC 3. Specifically, the RF front-end circuit 2 transmits an RF signal (here, an RF transmission signal) outputted from the RFIC 3 to the antenna element 1 through a transmission-side signal path that connects a transmission terminal Tx and an antenna terminal ANT. Also, the RF front-end circuit 2 transmits an RF signal (here, an RF reception signal) received by the antenna element 1 to the RFIC 3 through a reception-side signal path that connects the antenna terminal ANT and a reception terminal Rx. The detailed configuration of the RF front-end circuit 2 will be described below.

The RFIC 3 is an RF signal processing circuit that processes RF signals transmitted/received by the antenna element 1. Specifically, the RFIC 3 performs signal processing, such as down-converting, on an RF signal (here, an RF reception signal) received from the antenna element 1 through the reception-side signal path of the RF front-end circuit 2, and outputs a reception signal generated through the signal processing to a baseband signal processing circuit (not illustrated). Also, the RFIC 3 performs signal processing, such as up-converting, on a transmission signal received from the baseband signal processing circuit, and outputs an RF signal (here, an RF transmission signal) generated through the signal processing to the transmission-side signal path of the RF front-end circuit 2.

[1.2 Configuration of RF Front-End Circuit]

Next, the detailed configuration of the RF front-end circuit 2 will be described.

As illustrated in FIG. 1, the RF front-end circuit 2 includes an impedance matching circuit 21, filter circuits 22 and 23, a transmission amplifier circuit 24, a reception amplifier circuit 26, and a controller 27. The impedance matching circuit 21 and the filter circuits 22 and 23 constitute a filter module 20, which is an RF filter device.

It is sufficient that the RF front-end circuit 2 include the filter module 20. The RF front-end circuit 2 need not necessarily include at least one of the transmission amplifier circuit 24, the reception amplifier circuit 26, and the controller 27. In addition, it is sufficient that the filter module 20 include a tunable filter having a frequency change function (in the present embodiment, the filter circuit 22) among the filter circuits 22 and 23. The filter module 20 need not necessarily include a fixed filter not having a frequency change function (in the present embodiment, the filter circuit 23).

The impedance matching circuit 21 is a variable impedance matching circuit capable of changing an element value for achieving impedance matching (at least one of an impedance value and an admittance value), and is disposed in a preceding stage or a subsequent stage (here, a subsequent stage) of the filter circuit 22 (RF filter circuit). That is, the impedance matching circuit 21 is a circuit that achieves impedance matching between the impedance of the filter circuit 22 and the predetermined impedance (for example, 50Ω), that is, a circuit that adjusts the impedance of the filter circuit 22 to the predetermined impedance.

In the present embodiment, the impedance matching circuit 21 is connected to a common connection point N to which the filter circuit 22 and the filter circuit 23 are connected. That is, the impedance matching circuit 21 is disposed in common for the filter circuits 22 and 23, and furthermore achieves impedance matching between the impedance of the filter circuit 23 and the predetermined impedance. Specifically, the impedance matching circuit 21 is disposed on a path that branches into the transmission-side signal path including the filter circuit 22 and the reception-side signal path including the filter circuit 23. That is, the impedance matching circuit 21 is disposed in a subsequent stage of the filter circuit 22 and in a preceding stage of the filter circuit 23. The details of the impedance matching circuit 21 will be described below.

The position of the impedance matching circuit 21 is not limited thereto. For example, the impedance matching circuit 21 may be disposed only for the filter circuit 22, for example, may be disposed between the filter circuit 22 and the node at which the transmission-side signal path and the reception-side signal path join together. Alternatively, for example, the impedance matching circuit 21 may be disposed between the transmission amplifier circuit 24 and the filter circuit 22. In such arrangement, since the output impedance of the transmission amplifier circuit 24 is typically lower than 50Ω (for example, 3Ω), the impedance matching circuit 21 may achieve matching between the impedance (here, input impedance) of the filter circuit 22 and the foregoing output impedance lower than 50Ω. Here, "to achieve matching (impedance matching)" includes not only "to make impedances completely match" but also "to make impedances nearly match", and includes, for example, "to cause VSWR to be within a range of 2.2 or less.

The filter circuit 22 is a tunable filter whose pass band is changed to a first pass band or a second pass band. That is, the filter circuit 22 is configured such that the pass band is able to have a first bandpass characteristic and a second bandpass characteristic different from each other. In the present embodiment, the filter circuit 22 is a transmission filter in which the first pass band is the transmission band of Band A1 and the second pass band is the transmission band of Band A2, and is disposed on the transmission-side signal path. The detailed configuration of the filter circuit 22 will be described below.

The filter circuit 23 is a filter whose pass band is fixed. In the present embodiment, the filter circuit 23 is a reception filter in which the pass band is the reception bands of Band A1 and Band A2, and is disposed on the reception-side signal path. Alternatively, the filter circuit 23 may be a tunable filter whose pass band is changed like the filter circuit 22.

The transmission amplifier circuit 24 is a power amplifier that amplifies the power of an RF transmission signal outputted from the RFIC 3. In the present embodiment, the transmission amplifier circuit 24 is disposed between the filter circuit 22 and the transmission terminal Tx.

The reception amplifier circuit 26 is a low-noise amplifier that amplifies the power of an RF reception signal received by the antenna element 1. In the present embodiment, the reception amplifier circuit 26 is disposed between the filter circuit 23 and the reception terminal Rx.

The controller 27 controls ON and OFF of each switch included in the filter module 20 (RF filter device) on the basis of a frequency band to be used. Specifically, the controller 27 switches between ON and OFF of each switch by using a control signal φctrl, thereby switching the impedance of the impedance matching circuit 21, and the frequencies of the pass band or the frequency of at least one attenuation pole of the filter circuit 22. That is, the filter module 20 includes a control line 271 that is provided in common for the filter circuit 22 (RF filter circuit) and the impedance matching circuit 21 and that transmits the control signal φctrl that switches between ON and OFF of a switch of the filter circuit 22 (first switch element) and a switch of the impedance matching circuit 21 (second switch element).

The RF front-end circuit 2 having the above-described configuration transmits an RF signal by appropriately switching the impedance of the impedance matching circuit 21 and the pass band of the filter circuit 22 in accordance with the control signal φctrl from the controller 27.

[1.3 Circuit Configuration of Filter Module]

Hereinafter, a description will be given of the circuit configuration of the filter module 20 constituted by the impedance matching circuit 21 and the filter circuits 22 and 23, using a filter circuit configuration that supports Long Term Evolution (LTE) and that supports Bands (frequency bands) defined by Third Generation Partnership Project (3GPP) (hereinafter Band 28a Tx and Band 28b Tx) as an example, with reference to FIG. 2.

Figure 2:
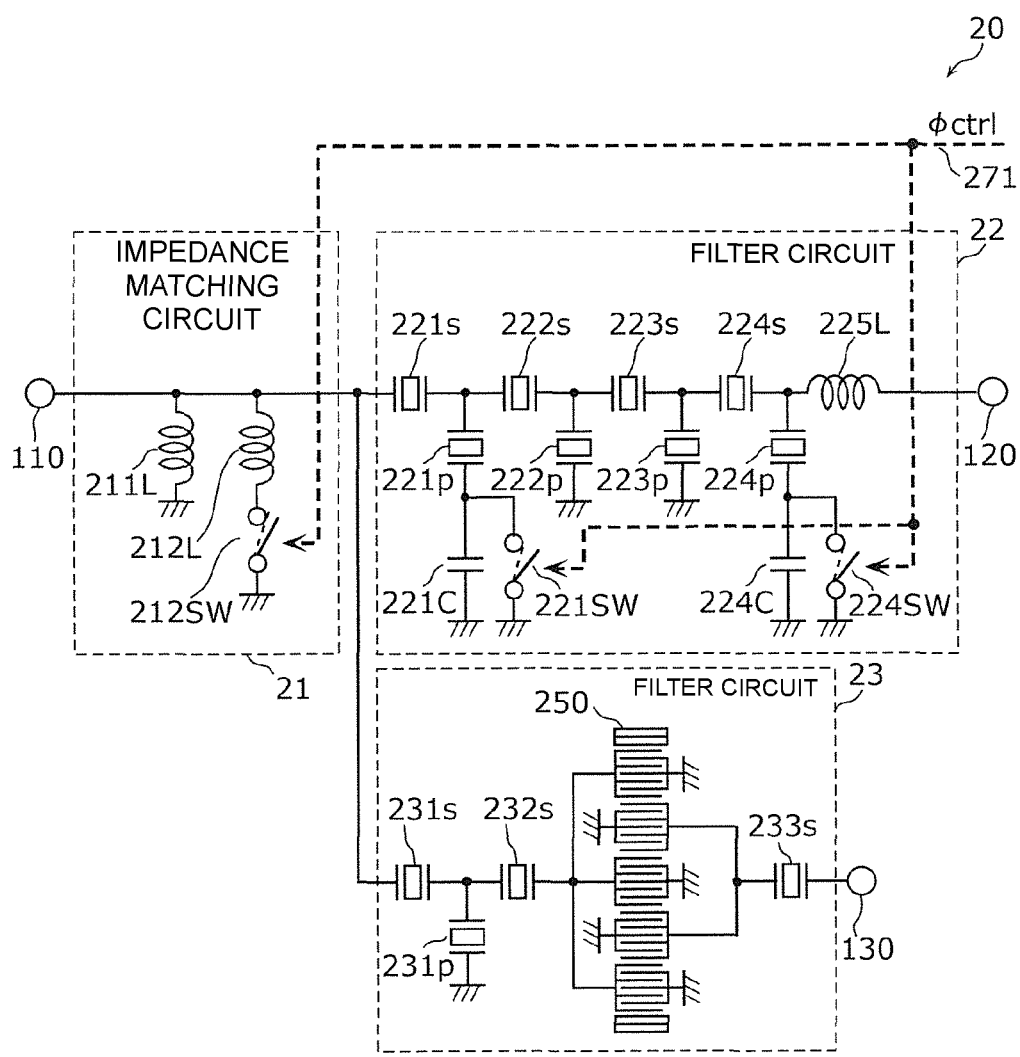
FIG. 2 is a circuit configuration diagram of a filter module according to the first embodiment.

FIG. 2 is a circuit configuration diagram of the filter module 20 according to the present embodiment.

First, a description will be given of the frequency bands allocated to individual bands.

Band 28a has a reception band of 758-788 MHz and a transmission band of 703-733 MHz. Band 28b has a reception band of 773-803 MHz and a transmission band of 718-748 MHz. Hereinafter, the reception band (Rx) and the transmission band (Tx) of each band may be referred to in a simplified manner, with the name of the band followed by a symbol representing a reception band or a transmission band. For example, the transmission band (Tx) of Band 28a may be referred to as "Band 28a Tx".

[1.3.1 Circuit Configuration of Filter Circuit (Tunable Filter)]

These bands are used exclusively, for example. Thus, the filter circuit 22 according to the present embodiment is configured as a tunable filter whose pass band can be switched to either of Band 28a Tx and Band 28b Tx.

The filter circuit 22 is an RF filter circuit that includes switches 221SW and 224SW (first switch element), the pass band thereof being switched in accordance with switching between ON and OFF of the switches 221SW and 224SW. It is sufficient that the filter circuit 22 include at least one first switch element.

Specifically, the filter circuit 22 has, as a basic configuration, a ladder filter structure constituted by series-arm resonators (in the present embodiment, four series-arm resonators 221s to 224s) and parallel-arm resonators (in the present embodiment, four parallel-arm resonators 221p to 224p). In addition, the filter circuit 22 includes, as an additional configuration added to the basic configuration to change the pass band, a capacitor (in the present embodiment, capacitors 221C and 224C) connected in series to at least one parallel-arm resonator (in the present embodiment, two parallel-arm resonators 221p and 224p) and a switch (in the present embodiment, switches 221SW and 224SW) connected in parallel to the capacitor. In addition, in the present embodiment, the filter circuit 22 further includes an inductor 225L for adjusting a phase or the like, which is located near a transmission terminal 120.

The number of stages in the ladder filter structure of the filter circuit 22 is not limited to four and may be one, for example.

In the filter circuit 22 having the above-described configuration, when the switches 221SW and 224SW are ON, the pass band is determined by the impedance characteristics of the series-arm resonators 221s to 224s and the impedance characteristics of the parallel-arm resonators 221p to 224p.

Specifically, when the switches 221SW and 224SW are ON, the parallel-arm resonators 221p and 224p are connected to the ground, and thus the impedances of the capacitors 221C and 224C do not affect the impedance of the filter circuit 22. That is, at this time, the capacitors 221C and 224C are in an ineffective state, and thus the filter circuit 22 has filter characteristics in which Band 28a Tx is the pass band and which are determined by the original characteristics of the parallel-arm resonators 221p and 224p (characteristics of the parallel-arm resonators 221p and 224p alone).

On the other hand, when the switches 221SW and 224SW are OFF, the pass band is determined by the impedance characteristics of the series-arm resonators 221s to 224s and the impedance characteristics of composite characteristics of the parallel-arm resonators 221p to 224p and the capacitors 221C and 224C.

Specifically, when the switches 221SW and 224SW are OFF, the capacitors 221C and 224C are added to the parallel-arm resonators 221p and 224p, and thus the impedances of the capacitors 221C and 224C affect the impedance of the filter circuit 22. That is, at this time, the capacitors 221C and 224C are in an effective state, and thus the filter circuit 22 has filter characteristics that depend on the composite characteristics of the parallel-arm resonator 221p and the capacitor 221C and the composite characteristics of the parallel-arm resonator 224p and the capacitor 224C.

Here, in the composite characteristics of the parallel-arm resonator 221p and the capacitor 221C, the resonant frequency is shifted to the high band side compared with the original characteristics of the parallel-arm resonator 221p. Also, in the composite characteristics of the parallel-arm resonator 224p and the capacitor 224C, the resonant frequency is shifted to the high band side compared with the original characteristics of the parallel-arm resonator 224p.

Typically, in the case of configuring a bandpass filter using ladder resonators, a parallel-arm resonator and a series-arm resonator that form the same stage respectively have an anti-resonant frequency fap and a resonant frequency frs that are close to each other. Accordingly, the frequencies near a resonant frequency frp of the parallel-arm resonator correspond to a low-frequency-side stop band of the bandpass filter. In addition, the frequencies near the anti-resonant frequency fap of the parallel-arm resonator and the resonant frequency frs of the series-arm resonator correspond to a signal pass band of the bandpass filter. In addition, the frequencies near an anti-resonant frequency fas of the series-arm resonator correspond to a high-frequency-side stop band of the bandpass filter.

Thus, the filter circuit 22 has filter characteristics in which, when the switches 221SW and 224SW are OFF, compared with when the switches 221SW and 224SW are ON, the region on the low band side of the pass band is reduced (i.e., the lower end of the pass band is shifted to the high band side), and Band 28b Tx serves as the pass band. That is, an RF signal in a so-called DTV band (470-710 MHz) allocated to the digital television broadcasting in Japan can be attenuated.

In this way, the filter circuit 22 is able to switch the pass band to either of Band 28a Tx (first pass band) and Band 28b Tx (second pass band) in accordance with switching between ON and OFF of the switches 221SW and 224SW.

It is sufficient that the filter circuit 22 be able to switch the frequencies of a plurality of pass bands or the frequency of at least one attenuation pole. For example, the filter circuit 22 may switch the frequencies of three or more pass bands or the frequency of at least one attenuation pole. The at least one attenuation pole whose frequency is switched by the filter circuit 22 is not limited to an attenuation pole near the pass band and may be an attenuation pole that is sufficiently far from the pass band.

[1.3.2 Circuit Configuration of Filter Circuit (Fixed Filter)]

In the present embodiment, the filter circuit 23 on the reception side is a fixed filter that does not have a frequency change function and that has a fixed pass band. That is, the filter circuit 23 on the reception side is a filter that has a pass band including Band 28a Rx and Band 28b Rx.

Specifically, the filter circuit 23 is a circuit in which a longitudinally coupled filter structure is added to a ladder filter structure, and is an RF filter circuit including series-arm resonators 231s to 233s, a parallel-arm resonator 231p, and a longitudinally coupled resonator 250. The parallel-arm resonator 231p is connected to a node between the series-arm resonator 231s and the series-arm resonator 232s. The longitudinally coupled resonator 250 is connected between the series-arm resonator 232s and the series-arm resonator 233s.

Each resonator of the filter circuits 22 and 23 is a resonator that uses a surface acoustic wave (SAW). Accordingly, the filter circuits 22 and 23 can be constituted by interdigital transducer (IDT) electrodes formed on a piezoelectric substrate, and thus it is possible to obtain compact and low-profile filter circuits having bandpass characteristics with a high degree of steepness.

Typically, a longitudinally coupled filter structure has a low electric power handling capability, and thus it is preferable that such a filter structure be not used as the filter circuit 22 on the transmission side. However, the filter circuit 22 on the transmission side may have a longitudinally coupled filter structure, and the filter circuit 23 on the reception side may have a ladder filter structure.

In addition, each resonator of the filter circuits 22 and 23 (series-arm resonator and parallel-arm resonator) may be constituted by a plurality of resonators formed by dividing one elastic wave resonator in series.

In addition, each resonator of the filter circuits 22 and 23 need not necessarily be a SAW resonator, and may be a resonator that uses a bulk acoustic wave (BAW). In addition, each of the filter circuits 22 and 23 need not necessarily have a configuration including resonators having a frequency at which the impedance is minimum (ideally 0) and a frequency at which the impedance is maximum (ideally infinite), and may be an LC resonant filter or a dielectric filter.

[1.3.3 Circuit Configuration of Impedance Matching Circuit]

In the filter circuit 22 having the above-described configuration, the impedance may be changed by a change in the electrical characteristics of the filter circuit 22 when the pass band is switched. Thus, the impedance matching circuit 21 according to the present embodiment is configured to be able to change the element value for achieving impedance matching, and switches the impedance value in accordance with a change in the impedance of the filter circuit 22.

Specifically, the impedance matching circuit 21 includes inductors 211L and 212L (impedance elements) and a switch 212SW. The inductors 211L and 212L are disposed on paths that shunt a signal path for transmitting an RF signal and the ground. The inductor 211L is an impedance element of a so-called shunt connection type that has one terminal connected to the signal path for transmitting an RF signal and the other terminal connected to the ground. The inductor 212L and the switch 212SW are connected in series to each other and are disposed on the foregoing shunt path. In the present embodiment, one terminal of the inductor 212L is connected to the signal path for transmitting an RF signal.

In the impedance matching circuit 21 having the above-described configuration, when the switch 212SW is in ON, the inductors 211L and 212L are connected in parallel to each other. Thus, at this time, the entire impedance matching circuit 21 has a composite inductance value of the inductors 211L and 212L as an element value.

On the other hand, when the switch 212SW is in OFF the impedance matching circuit 21 has an original inductance value of the inductor 211L (the inductance value of the inductor 211L alone) as an element value.

As described above, in the impedance matching circuit 21, the element value for achieving impedance matching is switched in accordance with switching between ON and OFF of the switch 212SW, and thus impedance matching can be achieved even if the impedance of the filter circuit 22 is changed.

Specifically, the impedance matching circuit 21 includes the inductor 211L (impedance element) that is connected in series between the ground and the path connecting the input/output terminals (in FIG. 2, the path connecting an antenna terminal 110 to the transmission terminal 120 and a reception terminal 130), and the inductor 212L (impedance element) and the switch 212SW (second switch element) that are connected in parallel to the inductor 211L and that are connected in series to each other.

Accordingly, in the impedance matching circuit 21, a susceptance component for admittance varies between a case where the switch 212SW is ON and a case where the switch 212SW is OFF.

[1.4 Operation of Filter Module]

The filter module 20 having the above-described configuration operates in the following manner in accordance with the control signal ϕctrl from the controller 27.

In the present embodiment, the switch 212SW of the impedance matching circuit 21 and the switches 221SW and 224SW of the filter circuit 22 are ON when the control signal ϕctrl is at a high level. On the other hand, when the control signal ϕctrl is at a low level, the switch 212SW of the impedance matching circuit 21 and the switches 221SW and 224SW of the filter circuit 22 are OFF.

That is, the switches 221SW and 224SW (first switch element) and the switch 212SW (second switch element) synchronize with each other regarding the timing of switching between ON and OFF. In the present embodiment, the switches 221SW and 224SW and the switch 212SW are simultaneously turned ON (i.e., both the first switch element and the second switch element are turned ON) or turned OFF (i.e., both the first switch element and the second switch element are turned OFF).

Here, "synchronize" includes not only a case where the timings completely match but also a case where the timings are slightly different due to a delay resulting from wiring of the control line 271.

Figure 3:
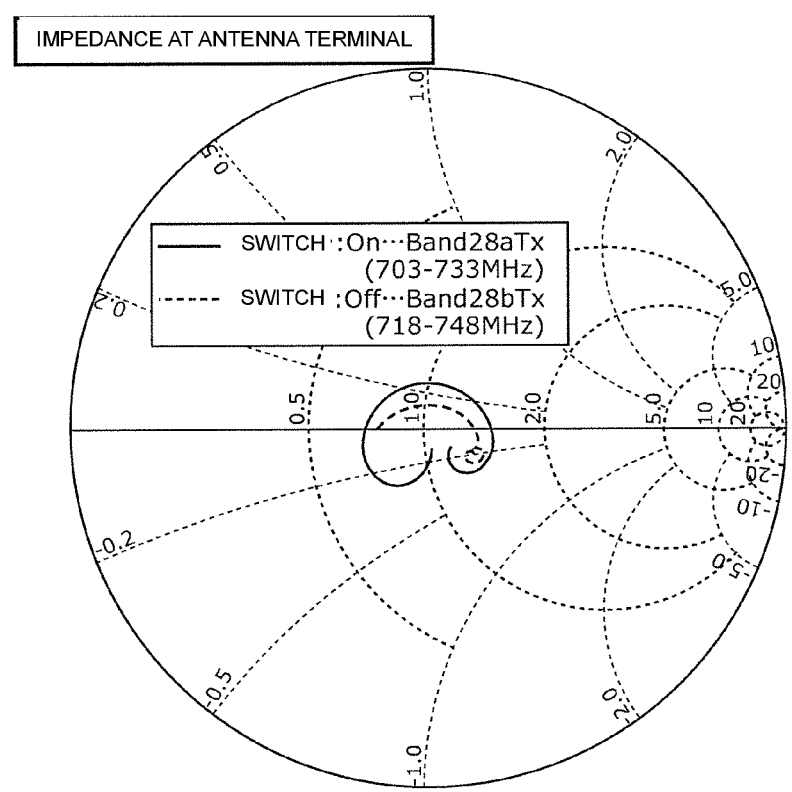
FIG. 3 is a Smith chart illustrating impedance at an input/output terminal of the filter module according to the first embodiment.
Figure 4A:
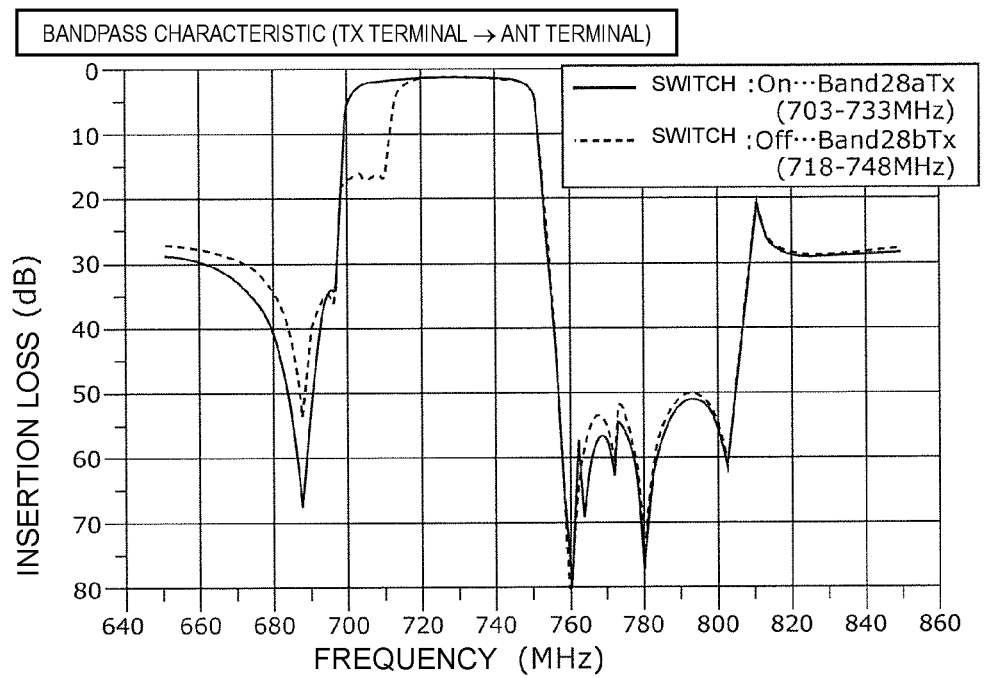
FIG. 4A is a graph illustrating a bandpass characteristic of the filter module according to the first embodiment.
Figure 4B:
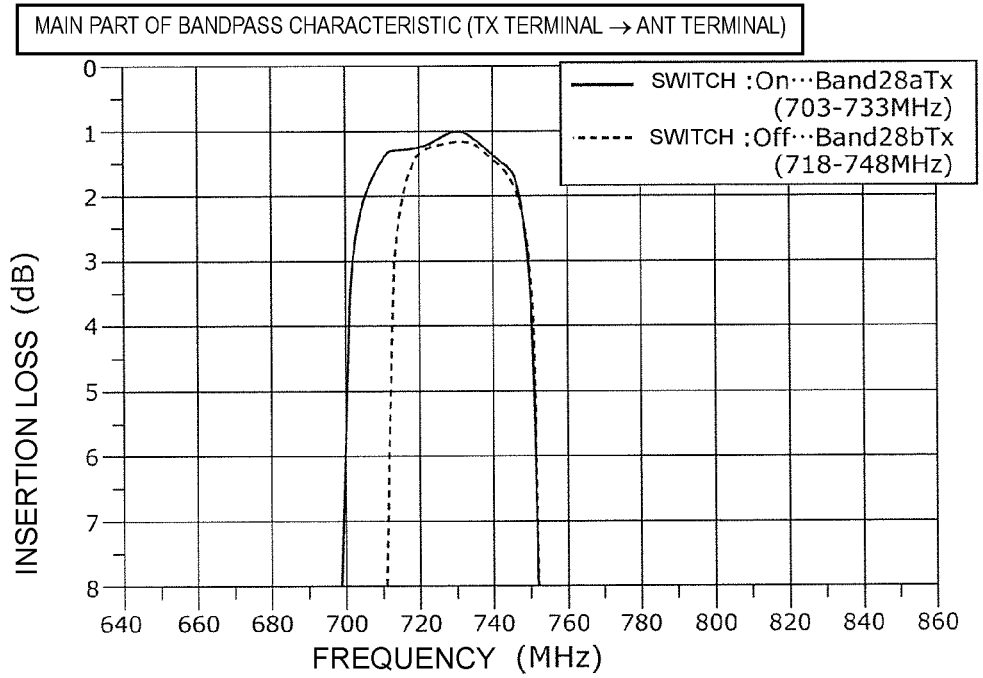
FIG. 4B is a graph in which a main part of FIG. 4A is enlarged.

FIGS. 3, 4A, and 4B are graphs illustrating the bandpass characteristic of the filter module 20 at this time. Specifically, FIG. 3 is a Smith chart illustrating the impedance at the input/output terminal (here, the antenna terminal 110) of the filter module 20. FIG. 4A is a graph illustrating the bandpass characteristic of the filter module 20, and FIG. 4B is a graph illustrating a main part of FIG. 4A in an enlarged manner.

FIGS. 4A and 4B illustrate, as the bandpass characteristic of the filter module 20, the insertion loss of a transmission signal path, and specifically illustrate the ratio (dB) of the strength of a signal outputted from the antenna terminal 110 to the strength of a signal inputted to the transmission terminal 120.

These are similarly applied to the following figures unless otherwise noted.

The bandpass characteristic illustrated in FIGS. 3, 4A, and 4B exhibits a favorable characteristic when the pass band of the filter circuit 22 is switched (here, when the pass band is switched from Band 28b Tx to Band 28a Tx) compared with the bandpass characteristic of a filter module including an impedance matching circuit having a fixed element value. For easy understanding of this, a description will be given using a comparative example for reference.

Figure 5:
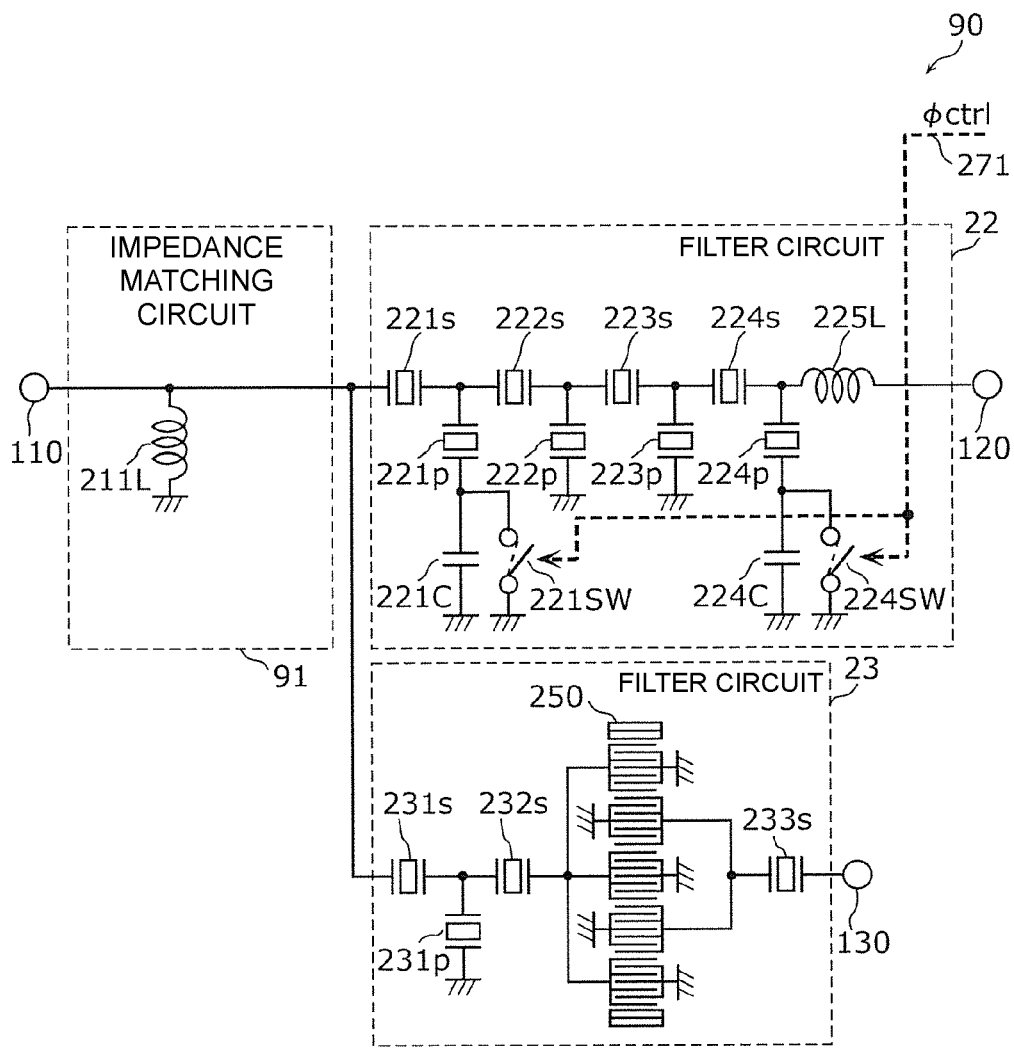
FIG. 5 is a circuit configuration diagram of a filter module according to a comparative example.

FIG. 5 is a circuit configuration diagram of a filter module 90 according to a comparative example.

The filter module 90 illustrated in FIG. 5 includes an impedance matching circuit 91 having a fixed element value, instead of the impedance matching circuit 21 of the filter module 20 illustrated in FIG. 2. The impedance matching circuit 91 is different from the impedance matching circuit 21 in that the impedance matching circuit 91 does not include the inductor 212L and the switch 212SW. That is, the filter module 90 according to the comparative example includes the impedance matching circuit 91 in which the element value for achieving impedance matching is fixed.

Figure 6:
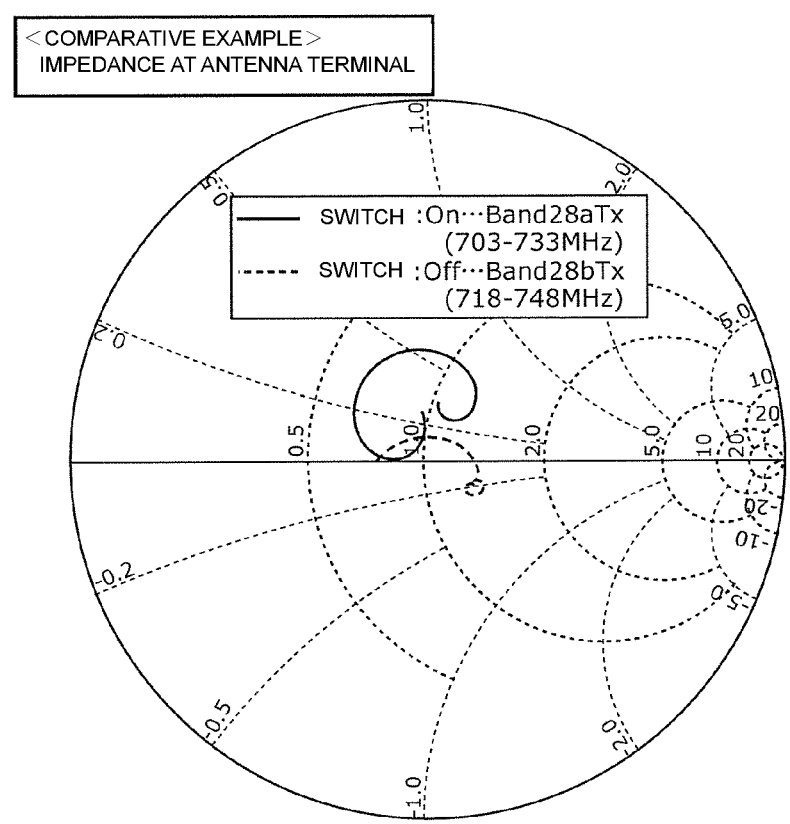
FIG. 6 is a Smith chart illustrating impedance at an input/output terminal of the filter module according to the comparative example.
Figure 7A:
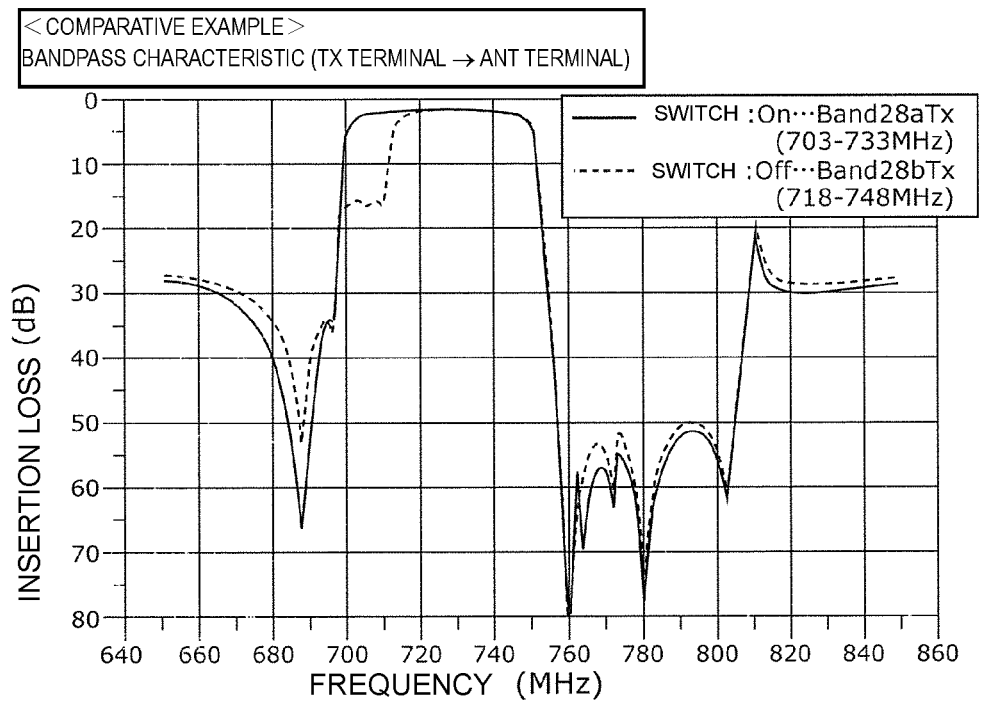
FIG. 7A is a graph illustrating a bandpass characteristic of the filter module according to the comparative example.
Figure 7B:
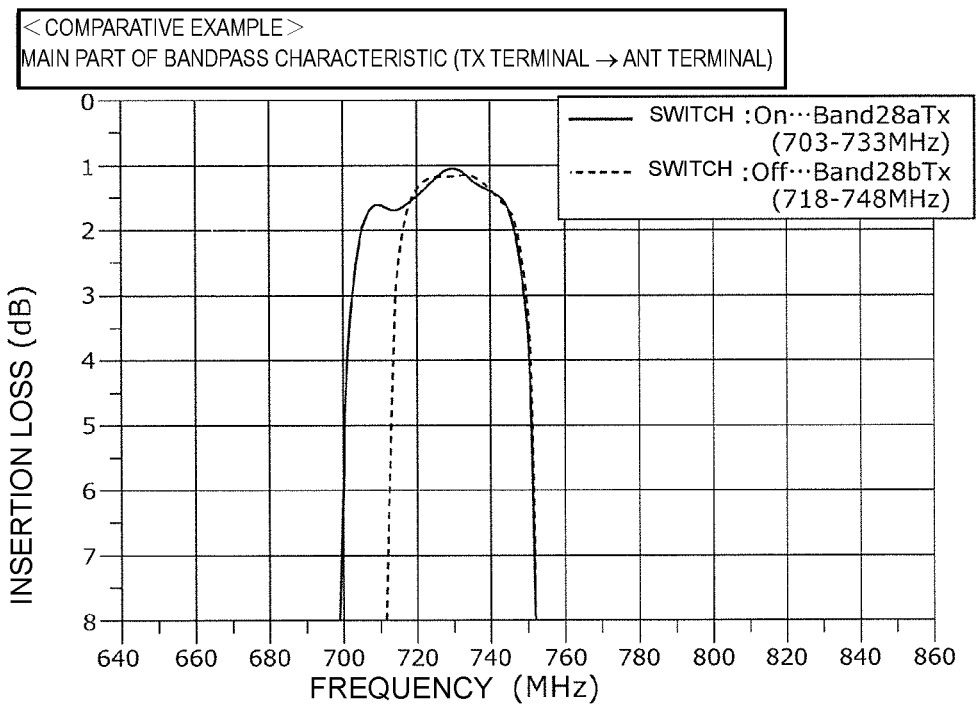
FIG. 7B is a graph in which a main part of FIG. 7A is enlarged.

FIGS. 6, 7A, and 7B are graphs illustrating the bandpass characteristic of the filter module 90 according to the comparative example, and illustrate the problems of the filter module 90 according to the comparative example. Specifically, FIG. 6 is a Smith chart illustrating the impedance at the input/output terminal (here, the antenna terminal 110) of the filter module 90. FIG. 7A is a graph illustrating the bandpass characteristic of the filter module 90, and FIG. 7B is a graph illustrating a main part of FIG. 7A in an enlarged manner.

As illustrated in FIG. 6, in the filter module 90 according to the comparative example, the impedance at the antenna terminal 110 is located at the center of the Smith chart (i.e., near 50Ω) in the pass band when the switches 221SW and 224SW of the filter circuit 22 are OFF (i.e., when the pass band is Band 28b Tx). That is, in this case, the impedance matching circuit 91 is able to achieve impedance matching so that the impedance at the antenna terminal 110 becomes the predetermined impedance (here, 50Ω). On the other hand, when the switches 221SW and 224SW of the filter circuit 22 are ON (i.e., when the pass band is Band 28a Tx), the impedance at the antenna terminal 110 is inductively deviated from the center of the Smith chart in the pass band. That is, in this case, the impedance matching circuit 91 is not able to achieve impedance matching.

As described above, in the filter module 90 according to the comparative example, the impedance at the antenna terminal 110 is deviated from the predetermined impedance when the impedance of the filter circuit 22 is changed in accordance with switching of the pass band.

As a result, in the filter module 90 according to the comparative example, insertion loss within the pass band may increase (loss may become greater) as illustrated in FIGS. 7A and 7B. Specifically, as illustrated in FIG. 7B, insertion loss increases at the lower end of the pass band when the switches 221SW and 224SW of the filter circuit 22 are OFF.

In contrast, as can be understood from the comparison between FIGS. 4A and 4B and FIGS. 7A and 7B, an increase in insertion loss within the pass band is suppressed in the filter module 20 according to the present embodiment, compared with the filter module 90 according to the comparative example. Specifically, as can be understood from the comparison between FIG. 4B and FIG. 7B, an increase in insertion loss is suppressed at the lower end of the pass band in the filter module 20 according to the present embodiment. That is, the filter module 20 according to the present embodiment is able to switch the pass band between Band 28a Tx and Band 28b Tx while suppressing an increase in insertion loss within the pass band.

[1.5 On-Board Configuration of Filter Module]

Next, a description will be given of an example of the structure of the filter module 20 according to the present embodiment.

Figure 8A:
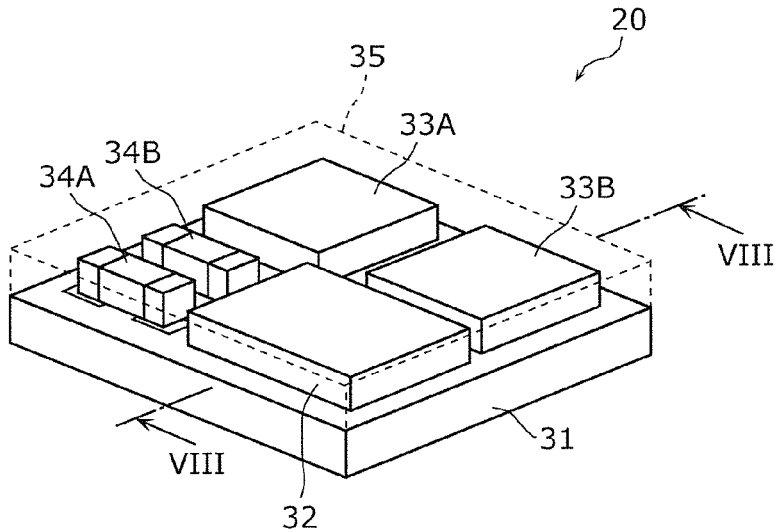
FIG. 8A is a perspective view of an external appearance of the filter module according to the first embodiment.
Figure 8B:
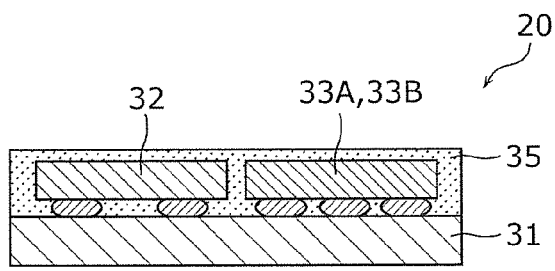
FIG. 8B is a cross-sectional view of the filter module according to the first embodiment.

FIG. 8A is a perspective view of the external appearance of the filter module 20 according to the first embodiment. FIG. 8B is a cross-sectional view of the filter module 20 according to the first embodiment, specifically a cross-sectional view taken along the line VIII-VIII in FIG. 8A. FIG. 8A illustrates, through a sealing member 35, the components sealed by the sealing member 35.

As illustrated in these figures, the filter module 20 includes a module substrate 31, a switch integrated circuit (IC) 32, resonance packages 33A and 33B, chip components 34A and 34B, and the sealing member 35. In the present embodiment, the filter module 20 has a stacked structure in which the switch IC 32, the resonance packages 33A and 33B, and the chip components 34A and 34B are disposed on the module substrate 31.

The module substrate 31 is, for example, a low temperature co-fired ceramics (LTCC) substrate that includes, built therein, elements having a relatively small element value among the inductors and capacitors constituting the filter module 20, and wiring lines constituting the filter module 20.

The switch IC 32 is a chip component including, built therein, the switches (212SW, 221SW, and 224SW) constituting the filter module 20, and includes, built therein, a plurality of SPST-type switches in which switching between ON and OFF is performed in accordance with a control signal inputted to a control terminal Pctrl (see FIG. 9 described below), for example.

The resonance package 33A includes, built therein, the resonators constituting the filter circuit 22 on the transmission side. The resonance package 33B includes, built therein, the resonators constituting the filter circuit 23 on the reception side. The resonance packages 33A and 33B are constituted by, for example, a piezoelectric substrate and IDT electrodes or the like.

The chip components 34A and 34B are elements having a relatively large element value among the inductors and capacitors constituting the filter module 20.

The sealing member 35 is, for example, a resin that seals the components disposed on the module substrate 31.

As described above, the filter module 20 according to the present embodiment has a stacked structure, and thus the packaging area can be saved. The structure of the filter module 20 is not limited to the stacked structure. For example, some of the components may be mounted on a substrate different from the module substrate 31.

Figure 9:
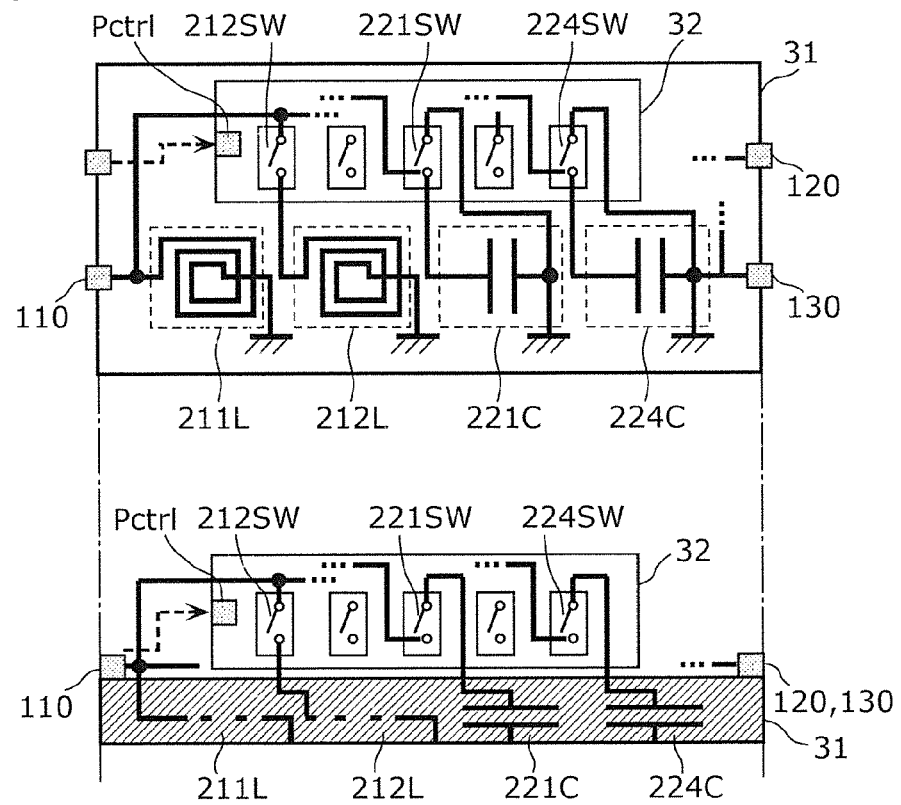
FIG. 9 is a diagram conceptually illustrating an on-board configuration of the filter module according to the first embodiment.

FIG. 9 is a diagram conceptually illustrating the on-board configuration of the filter module 20 according to the present embodiment. FIG. 9 includes a plan view (upper part) and a cross-sectional view (lower part) of the module substrate 31 and the switch IC 32.

As illustrated in FIG. 9, each of the inductors 211L and 212L is formed of, for example, a spiral-shaped planer coil pattern built in the module substrate 31. The individual coil patterns corresponding to the inductors 211L and 212L are formed in the same layer.

The coil pattern of each of the inductors 211L and 212L is not limited to the pattern shape illustrated in FIG. 9. The coil pattern may be a spiral coil pattern that extends in a plurality of layers constituting the module substrate 31, or may be a coil pattern extending along a direction perpendicular to the principal surface of the substrate. In addition, the number of turns of the coil pattern is not specified. Furthermore, the individual coil patterns may be formed in different layers, not in the same layer, and may overlap each other in a plan view of the module substrate 31.

As illustrated in FIG. 9, each of the capacitors 221C and 224C is formed of, for example, a pair of planer electrodes that face each other and that are built in the module substrate 31.

As illustrated in FIG. 9, the switch IC 32 includes a plurality of switches (in FIG. 9, five switches) and the control terminal Pctrl. That is, the switch IC 32 includes, built therein, a plurality of switches including the switch 212SW of the impedance matching circuit 21 and the switches 221SW and 224SW of the filter circuit 22. The control terminal Pctrl is connected to the control line 271 that transmits the control signal ϕctrl from the controller 27. Accordingly, the switch IC 32 switches between ON and OFF of the plurality of switches in accordance with the control signal ϕctrl.

FIG. 10A is a diagram illustrating the correspondence between the control signal ϕctrl and the states of the switches 212SW, 221SW, and 224SW according to the embodiment.

In the present embodiment, the switch 212SW of the impedance matching circuit 21 and the switches 221SW and 224SW of the filter circuit 22 are simultaneously turned ON or OFF in accordance with the control signal ϕctrl. As illustrated in FIG. 10A, for example, these switches are ON when the control signal ϕctrl is at a high level and are OFF when the control signal ϕctrl is at a low level.

It is sufficient that the switch 212SW of the impedance matching circuit 21 and the switches 221SW and 224SW of the filter circuit 22 synchronize with each other regarding the timing to be turned ON or OFF. Either of them may be OFF when the other is ON.

FIG. 10B is a diagram illustrating a modification example of the correspondence between the control signal ϕctrl and the states of the switches 212SW, 221SW, and 224SW according to the embodiment.

As illustrated in FIG. 10B, for example, the switch 212SW of the impedance matching circuit 21 may be ON and the switches 221SW and 224SW of the filter circuit 22 may be OFF when the control signal ϕctrl is at a high level, and the switch 212SW of the impedance matching circuit 21 may be OFF and the switches 221SW and 224SW of the filter circuit 22 may be ON when the control signal ϕctrl is at a low level.

Such a configuration is achieved when, for example, the filter module 20 includes a first switch IC including, built therein, the switch 212SW of the impedance matching circuit 21 and a second switch IC including, built therein, the switches 221SW and 224SW of the filter circuit 22. That is, in the first and second switch ICs, switching between ON and OFF of a switch is performed in accordance with the same control signal ϕctrl, and the polarity for ON and OFF is inverted between the switch in the first switch IC and the switch in the second switch IC.

[1.6 Advantages and the Like]

As described above, in the RF front-end circuit 2 (specifically, the filter module 20) according to the present embodiment, the switches 221SW and 224SW (first switch element) and the switch 212SW (second switch element) synchronize with each other regarding the timing of switching between ON and OFF.

Accordingly, when switching between ON and OFF of the switches 221SW and 224SW is performed to switch the frequencies of the pass band or the frequency of at least one attenuation pole, the element value of the impedance matching circuit 21 is switched by the switch 212SW in which switching between ON and OFF is performed in synchronization with the switches 221SW and 224SW. Thus, even if the impedance of the filter circuit 22 (RF filter circuit) is changed in accordance with the switching of the pass band, the impedance matching circuit 21 is able to achieve impedance matching between the changed impedance of the filter circuit 22 and the predetermined impedance. Accordingly, it is possible to switch the frequencies of the pass band or the frequency of at least one attenuation pole while suppressing an increase in insertion loss within the pass band.

In addition, since the control line 271 is provided in common for the filter circuit 22 (RF filter circuit) and the impedance matching circuit 21, the circuit configuration is simplified.

In addition, since both the switches 221SW and 224SW and the switch 212SW are turned ON or OFF, these switches can be built in the same switch IC.

In addition, since the impedance matching circuit 21 is disposed on a path at which a plurality of signal paths join together, the impedance matching circuit 21 can be shared by a plurality of filter circuits (in the embodiment, the two filter circuits 22 and 23). Thus, the size and cost of the RF front-end circuit 2 (specifically, the filter module 20) can be reduced.

The configurations of the impedance matching circuit 21 and the tunable filter (in the above description, the filter circuit 22) constituting the filter module 20 are not limited to the configurations described above, and may be appropriately designed in accordance with the required specifications, such as the pass band and electrical characteristics of the filter module 20. Hereinafter, a description will be given of various modification examples of the impedance matching circuit 21 and the tunable filter.

[1.7 Modification Examples of Impedance Matching Circuit]

Figure 11A:
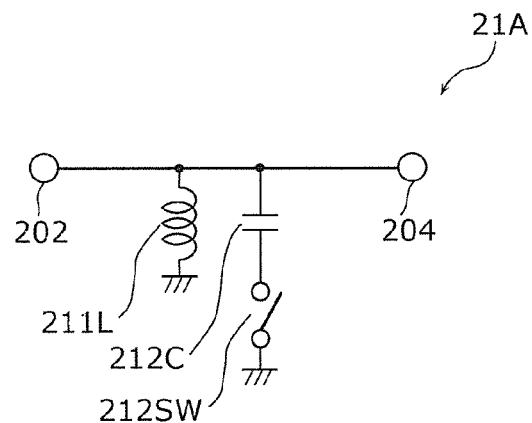
FIG. 11A is a circuit configuration diagram of an impedance matching circuit according to a first modification example of the first embodiment.
Figure 11B:
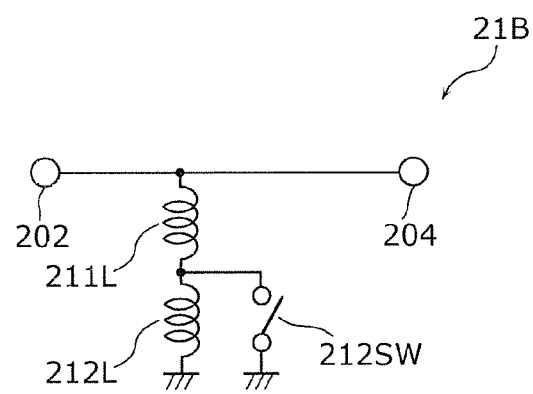
FIG. 11B is a circuit configuration diagram of an impedance matching circuit according to a second modification example of the first embodiment.
Figure 11C:
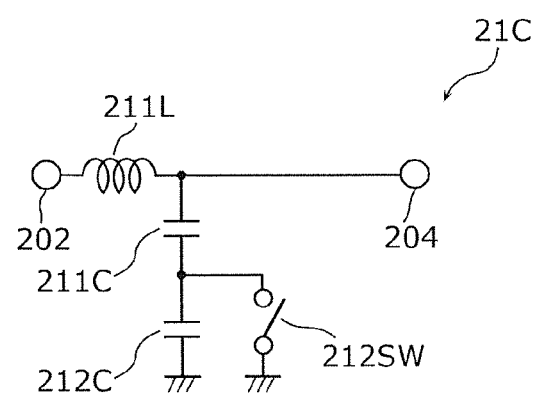
FIG. 11C is a circuit configuration diagram of an impedance matching circuit according to a third modification example of the first embodiment.

FIGS. 11A to 11C are circuit configuration diagrams of impedance matching circuits according to first to third modification examples of the first embodiment.

FIG. 11A is a circuit configuration diagram of the impedance matching circuit according to the first modification example of the first embodiment. The impedance matching circuit 21A illustrated in FIG. 11A is different from the impedance matching circuit 21 illustrated in FIG. 2 in that the impedance matching circuit 21A includes a capacitor 212C instead of the inductor 212L.

FIG. 11B is a circuit configuration diagram of the impedance matching circuit according to the second modification example of the first embodiment. The impedance matching circuit 21B illustrated in FIG. 11B is different from the impedance matching circuit 21 illustrated in FIG. 2 in that the inductors 211L and 212L are connected in series to each other and are connected in series between the ground and a path that connects an input/output terminal 202 and an input/output terminal 204.

FIG. 11C is a circuit configuration diagram of the impedance matching circuit according to the third modification example of the first embodiment. The impedance matching circuit 21C illustrated in FIG. 11C is different from the impedance matching circuit 21 illustrated in FIG. 2 in that capacitors 211C and 212C are connected in series to each other and are connected in series between the ground and the path that connects the input/output terminal 202 and the input/output terminal 204. In addition, the switch 212SW is connected in parallel to the capacitor 212C. Furthermore, the inductor 211L is connected in series to the path that connects the input/output terminal 202 and the input/output terminal 204.

With any of the impedance matching circuits 21A to 21C having the above-described configurations, the element value (here, a susceptance component of an admittance value) for achieving impedance matching can be changed in accordance with switching between ON and OFF of the switch 212SW. Thus, as in the above-described impedance matching circuit 21, impedance matching can be achieved even if the impedance of the filter circuit 22 is changed.

In addition, in the impedance matching circuit 21C, the inductor 211L (impedance element) is connected in series to the path that connects the input/output terminal 202 and the input/output terminal 204, and thus a reactance component can be made inductive.

[1.8 Modification Examples of Filter Circuit]

FIGS. 12A to 12D are circuit configuration diagrams of filter circuits according to first to fourth modification examples of the first embodiment.

Each of filter circuits 22A, 22B, 22D, and 22E respectively illustrated in FIGS. 12A to 12D includes, in each stage of a ladder filter structure, an impedance element for changing the pass band and a switch (first switch element), compared with the filter circuit 22 illustrated in FIG. 2. That is, each of the filter circuits 22A, 22B, 22D, and 22E includes, in each stage of the ladder filter structure, an impedance element connected in series to a parallel-arm resonator and a switch connected in parallel to the impedance element, or an impedance element connected in parallel to a parallel-arm resonator and a switch connected in series to the impedance element, between the ground and a path that connects an input/output terminal 22m and an input/output terminal 22n.

Figure 12A:
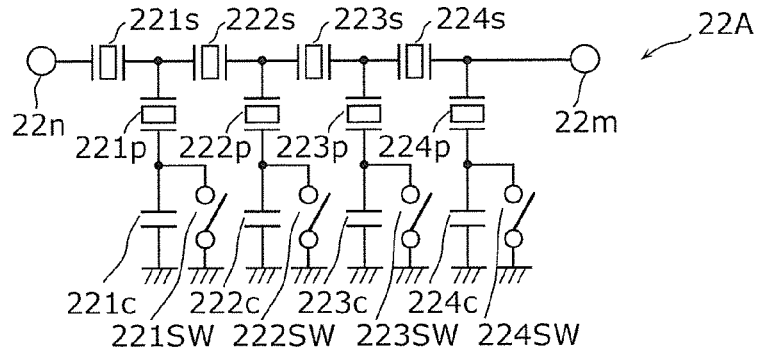
FIG. 12A is a circuit configuration diagram of a filter circuit according to a first modification example of the first embodiment.

FIG. 12A is a circuit configuration diagram of the filter circuit according to the first modification example of the first embodiment. The filter circuit 22A illustrated in FIG. 12A is different from the filter circuit 22 illustrated in FIG. 2 in that the filter circuit 22A includes, in the individual stages of the ladder filter structure, capacitors 221C to 224C (impedance elements) connected in series to the parallel-arm resonators 221p to 224p, and switches 221SW to 224SW connected in parallel to the capacitors 221C to 224C. Accordingly, the attenuation in the stop band on the low band side of the pass band can be increased when the switches 221SW to 224SW are OFF.

Figure 12B:
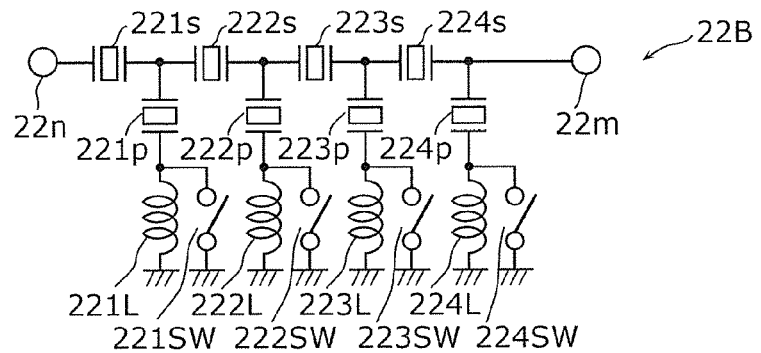
FIG. 12B is a circuit configuration diagram of a filter circuit according to a second modification example of the first embodiment.

FIG. 12B is a circuit configuration diagram of the filter circuit according to the second modification example of the first embodiment. The filter circuit 22B illustrated in FIG. 12B is different from the filter circuit 22A illustrated in FIG. 12A in that the filter circuit 22B includes inductors 221L to 224L (impedance elements) instead of the capacitors 221C to 224C. Accordingly, the region on the low band side of the pass band can be extended (i.e., the lower end of the pass band can be shifted to the low band side) when the switches 221SW to 224SW are OFF, compared with when the switches 221SW to 224SW are ON.

Figure 12C:
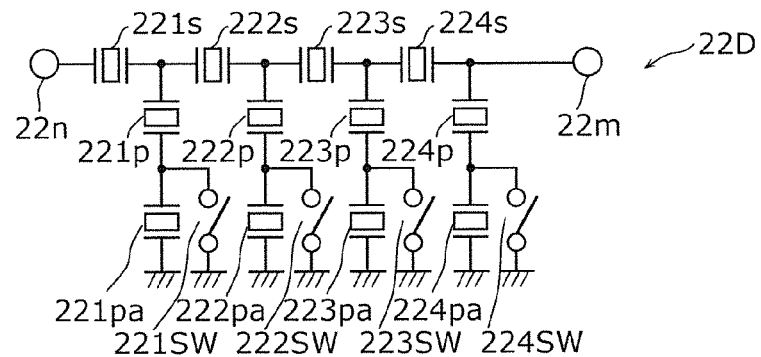
FIG. 12C is a circuit configuration diagram of a filter circuit according to a third modification example of the first embodiment.

FIG. 12C is a circuit configuration diagram of the filter circuit according to the third modification example of the first embodiment. The filter circuit 22D illustrated in FIG. 12C is different from the filter circuit 22A illustrated in FIG. 12A in that the filter circuit 22D includes resonators 221pa to 224*pa* (impedance elements) instead of the capacitors 221C to 224C. Accordingly, the attenuation pole on the low band side of the pass band can be shifted to the high band side and also an attenuation pole can be added to the high band side of the pass band, and it becomes possible to obtain attenuation on the high band side of the pass band when the switches 221SW to 224SW are OFF, compared with when the switches 221SW to 224SW are ON.

Figure 12D:
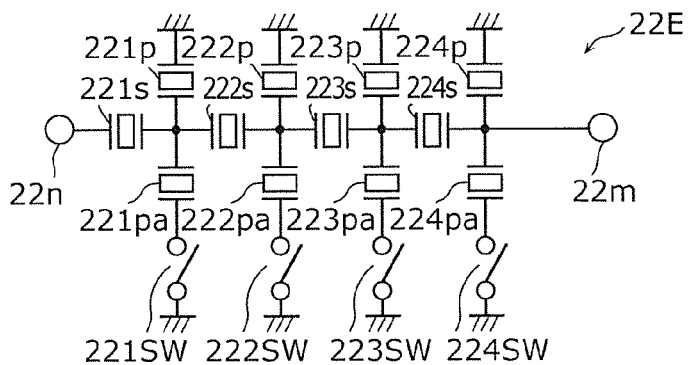
FIG. 12D is a circuit configuration diagram of a filter circuit according to a fourth modification example of the first embodiment.

FIG. 12D is a circuit configuration diagram of the filter circuit according to the fourth modification example of the first embodiment. The filter circuit 22E illustrated in FIG. 12D is different from the filter circuit 22A illustrated in FIG. 12A in that the parallel-arm resonators 221*p* to 224*p*, instead of the capacitors 221C to 224C, are connected to the ground without other impedance elements interposed therebetween, and the resonators 221*pa* to 224*pa* (impedance elements) and the switches 221SW to 224SW connected in series to each other are connected in parallel to the parallel-arm resonators 221*p* to 224*p*, in the individual stages of the ladder filter structure. Accordingly, with the resonators 221*pa* to 224*pa* having resonant frequencies higher than those of the parallel-arm resonators 221*p* to 224*p* being provided in the individual stages, the pole (attenuation pole) on the high band side of the pass band may be determined by the resonant frequencies of the resonators 221*pa* to 224*pa* when the switches 221SW to 224SW are ON. Thus, the region on the high band side of the pass band can be reduced (i.e., the higher end of the pass band can be shifted to the low band side) compared with when the switches 221SW to 224SW are OFF.

Modification Example of First Embodiment

In the first embodiment, the switches 221SW and 224SW (first switch element) of the filter circuit 22 and the switch 212SW (second switch element) of the impedance matching circuit 21 synchronize with each other regarding the timing of switching between ON and OFF. In contrast, in the modification example, the switch 221SW and the switch 212SW synchronize with each other regarding the switching timing, but the switch 224SW does not synchronize regarding the switching timing, and the impedance matching circuit further includes a switch that synchronize with the switch 224SW regarding the switching timing.

Figure 13:
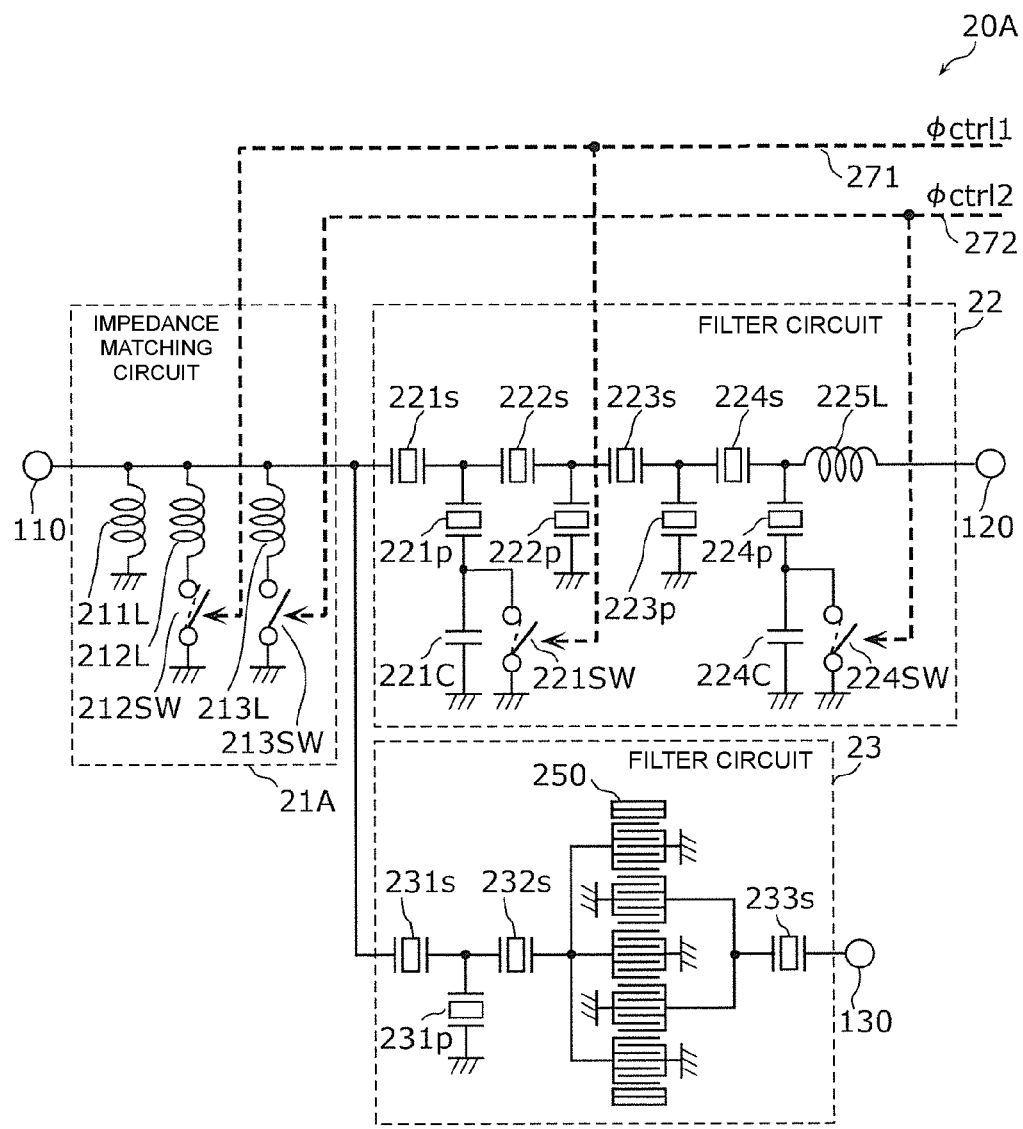
FIG. 13 is a circuit configuration diagram of a filter module according to a modification example of the first embodiment.

FIG. 13 is a circuit configuration diagram of a filter module 20A according to a modification example of the first embodiment.

The filter module 20A illustrated in FIG. 13 is different from the filter module 20 in FIG. 2 in the configuration of the impedance matching circuit 21A.

Compared with the impedance matching circuit 21, the impedance matching circuit 21A further includes a switch 213SW (fourth switch element), and the element value for achieving impedance matching is switched in accordance with switching between ON and OFF of the switch 213SW. Specifically, compared with the impedance matching circuit 21, the impedance matching circuit 21A includes an inductor 213L and the switch 213SW (fourth switch element) connected in series to each other between the ground and a path for transmitting an RF signal.

In the present modification example, the switch 221SW (first switch element) of the filter circuit 22 and the switch 212SW (second switch element) of the impedance matching circuit 21A are turned ON or OFF in accordance with a control signal ϕctrl1 from the controller 27. That is, the switch 221SW and the switch 212SW synchronize with each other regarding the timing of switching between ON and OFF. Here, the control signal ϕctrl1 is transmitted through the control line 271 like the control signal ϕctrl according to the above-described embodiment.

In addition, the switch 224SW (third switch element) of the filter circuit 22 and the switch 213SW (fourth switch element) of the impedance matching circuit 21A are turned ON or OFF in accordance with a control signal ϕctrl2 from the controller 27. That is, the switch 224SW and the switch 213SW synchronize with each other regarding the timing of switching between ON and OFF. Here, the control signal ϕctrl2 is transmitted through a control line 272 that is different from the control line 271 through which the control signal ϕctrl is transmitted. In other words, the timing of switching between ON and OFF of the switch 221SW (first switch element) and the switch 212SW (second switch element) and the timing of switching between ON and OFF of the switch 224SW (third switch element) and the switch 213SW (fourth switch element) are independent of each other. That is, the filter module 20A includes the control line 272 that is provided in common for the filter circuit 22 and the impedance matching circuit 21A and that transmits the control signal for switching between ON and OFF of the switch 224SW and the switch 213SW.

In the filter module 20A having the above-described configuration, it is possible to achieve impedance matching by appropriately selecting ON or OFF of the switch 212SW (second switch element) and the switch 213SW (fourth switch element) while more finely adjusting the bandpass characteristic of the filter circuit 22 by appropriately selecting ON or OFF of the switch 221SW (first switch element) and the switch 224SW (third switch element).

Specifically, since the filter circuit 22 includes the switch 221SW (first switch element) and the switch 224SW (third switch element) that are turned ON or OFF at timings independent of each other, the pass band can be switched to a band different from Band 28*a* Tx (first pass band) and Band 28*b* Tx (second pass band). That is, the filter module 20A can be applied to a system that uses more bands. In addition, since the impedance matching circuit 21A includes the switch 213SW (fourth switch element) that is turned ON or OFF in synchronization with the switch 224SW (third switch element), it is possible to achieve impedance matching even if the filter circuit 22 switches the pass band to a band different from Band 28*a* Tx and Band 28*b* Tx.

The impedance elements constituting the impedance matching circuit are not limited to a shunt connection type, and may be inserted in series to a signal path for transmitting an RF signal. For example, the inductors 211L and 212L may be connected in series to each other and inserted into the signal path, and the switch 212SW may be connected in parallel to the inductor 211L.

With this configuration, the reactance is changed with respect to the impedance in a case where the switch 212SW is ON and in a case where the switch 212SW is OFF. Thus, as in the first embodiment and its modification example, impedance matching can be achieved even if the impedance of the filter circuit 22 (RF filter circuit) is changed in accordance with switching of the pass band. In addition, for example, when the inductance value of the inductor 211L is L1 and the inductance value of the inductor 212L is L2, two inductance values L1 and (L1+L2) can be selected in the two inductors. That is, a large inductor having an inductance value of (L1+L2) is not necessary, and two inductors each having an inductance value smaller than (L1+L2) allow an inductance value to be appropriately selected. Thus, the size of the circuit can be reduced, and impedance matching can be achieved even if the impedance of the filter circuit 22 is changed.

Second Embodiment

Meanwhile, in a tunable filter (frequency variable filter) whose pass band can be changed in accordance with switching between ON and OFF of a switch, the steepness of an attenuation slope may decrease and insertion loss may increase at the end of the pass band.

Accordingly, an RF filter circuit according to the present embodiment includes a series-arm resonator connected between a first input/output terminal and a second input/output terminal, and a parallel-arm circuit connected between the ground and a node on a path that connects the first input/output terminal and the second input/output terminal. Here, the parallel-arm circuit includes a first parallel-arm resonator having a first resonant frequency and a second parallel-arm resonator having a second resonant frequency higher than the first resonant frequency, the first parallel-arm resonator and the second parallel-arm resonator being connected between the node and the ground, and an impedance element and a switch element (corresponding to the first switch element according to the first embodiment and its modification example) that are connected in parallel to each other and that are connected in series to at least one of the first and second parallel-arm resonators between the node and the ground.

[2.1 Configuration of Filter (Tunable Filter)]

Figure 14A:
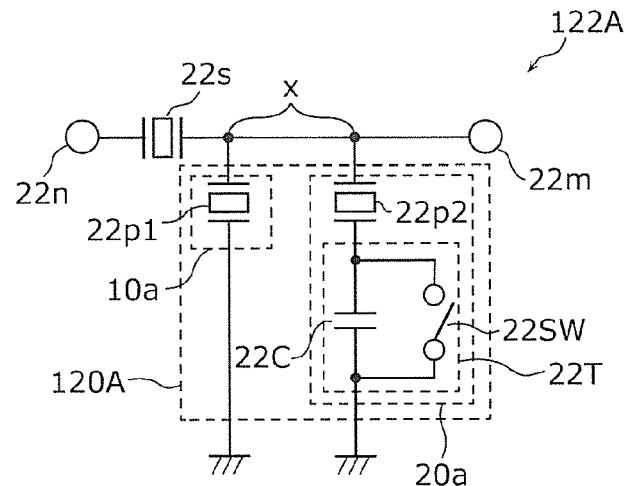
FIG. 14A is a circuit configuration diagram of a filter circuit according to a second embodiment.

FIG. 14A is a circuit configuration diagram of a filter circuit 122A according to the second embodiment. The filter circuit 122A illustrated in FIG. 14A includes a series-arm resonator 22s, parallel-arm resonators 22p1 and 22p2, a switch 22SW, and a capacitor 22C.

The series-arm resonator 22s is an example of a series-arm circuit connected between the input/output terminal 22m (first input/output terminal) and the input/output terminal 22n (second input/output terminal). That is, the series-arm resonator 22s is a resonator provided on a series arm that connects the input/output terminal 22m and the input/output terminal 22n.

The series-arm circuit is not limited thereto and may be a resonant circuit constituted by a plurality of resonators, such as a longitudinally coupled resonator. Furthermore, the series-arm circuit is not limited to a resonant circuit and may be an impedance element, such as an inductor or capacitor.

The parallel-arm resonators 22p1 and 22p2, the capacitor 22C, and the switch 22SW constitute a parallel-arm circuit 120A connected between the ground and nodes x on a path (on the series arm) that connects the input/output terminal 22m and the input/output terminal 22n. That is, the parallel-arm circuit 120A is provided on one parallel arm that connects the series arm and the ground. Accordingly, the filter circuit 122A has a filter structure including one series-arm circuit constituted by the series-arm resonator 22s and the one parallel-arm circuit 120A.

The parallel-arm circuit 120A has at least two resonant frequencies and at least two anti-resonant frequencies, and at least one resonant frequency and at least one anti-resonant frequency are shifted to the low band side or high band side in accordance with switching between ON and OFF of the switch 22SW.

Specifically, the parallel-arm circuit 120A includes a first circuit 10a that includes the parallel-arm resonator 22p1, and a second circuit 20a that is connected in parallel to the first circuit 10a and that includes the parallel-arm resonator 22p2. Furthermore, at least one of the first circuit 10a and the second circuit 20a includes a frequency variable circuit that is connected in series to the parallel-arm resonator 22p1 or 22p2 in the circuit and that includes an impedance element and a first switch element that are connected in parallel to each other. The frequency variable circuit having such a configuration shifts, in accordance with switching between ON and OFF of the switch 22SW, at least one resonant frequency among the at least two resonant frequencies in the parallel-arm circuit 120A and at least one anti-resonant frequency among the at least two anti-resonant frequencies in the parallel-arm circuit 120A to the low frequency side or high frequency side.

In the present embodiment, the first circuit 10a does not include a frequency variable circuit, whereas the second circuit 20a includes a frequency variable circuit 22T. The frequency variable circuit 22T includes, as the impedance element and the first switch element connected in parallel to each other, the capacitor 22C and the switch 22SW.

Regarding the connection order of the frequency variable circuit 22T and the parallel-arm resonator (here, the parallel-arm resonator 22p2), the frequency variable circuit 22T is connected between the parallel-arm resonator and the ground in the present embodiment. That is, the parallel-arm resonator is connected near the node x, and the frequency variable circuit 22T is connected near the ground. However, the connection order is not particularly limited thereto and may be reversed. However, if the connection order is reversed, the loss within the pass band of the filter circuit 122A increases. In addition, if the parallel-arm resonator is formed on a chip (package) for resonators together with other elastic wave resonators, an increase in the number of the terminals of the chip causes an increase in the chip size. Thus, from the viewpoint of the filter characteristics and reduction in size, it is preferable to adopt the connection order according to the present embodiment.

The parallel-arm resonator 22p1 is the first parallel-arm resonator, which is a resonator connected between the ground (reference terminal) and the node x on the path that connects the input/output terminal 22m and the input/output terminal 22n. That is, in the present embodiment, the first circuit 10a is constituted by only the parallel-arm resonator 22p1.

The parallel-arm resonator 22p2 is the second parallel-arm resonator, which is a resonator connected between the ground (reference terminal) and the node x on the path that connects the input/output terminal 22m and the input/output terminal 22n. In the present embodiment, the parallel-arm resonator 22p2 constitutes, together with the switch 22SW and the capacitor 22C, the second circuit 20a connected in parallel to the first circuit 10a. That is, in the present embodiment, the second circuit 20a is constituted by the parallel-arm resonator 22p2, the switch 22SW, and the capacitor 22C.

The parallel-arm resonator 22p2 has a resonant frequency different from the resonant frequency of the parallel-arm resonator 22p1, and an anti-resonant frequency different from the anti-resonant frequency of the parallel-arm resonator 22p1. In the present embodiment, the first resonant frequency, which is the resonant frequency of the parallel-arm resonator 22p1, is lower than the second resonant frequency, which is the resonant frequency of the parallel-arm resonator 22p2, and the anti-resonant frequency of the parallel-arm resonator 22p1 is lower than the anti-resonant frequency of the parallel-arm resonator 22p2. The "resonant frequency" is a frequency at which the impedance is minimum, and the "anti-resonant frequency" is a frequency at which the impedance is maximum.

In the present embodiment, the capacitor 22C is an impedance element connected in series to the parallel-arm resonator 22p2. The frequency variable width of the pass band of the filter circuit 122A depends on the element value of the capacitor 22C, for example, the frequency variable width increases as the element value of the capacitor 22C decreases. Thus, the element value of the capacitor 22C may be appropriately determined in accordance with the frequency specifications required for the filter circuit 122A. In addition, the capacitor 22C may be a variable capacitor, such as varicap or a digitally tunable capacitor (DTC).

The switch 22SW is the first switch element of a single pole single throw (SPST) type, for example, having one terminal connected to the connection node between the parallel-arm resonator 22p2 and the capacitor 22C and the other terminal connected to the ground. The switch 22SW is switched between ON and OFF in accordance with the control signal φctrl from the controller 27, thereby electrically connecting or disconnecting the connection node and the ground.

For example, the switch 22SW may be a field effect transistor (FET) switch made of GaAs or a complementary metal oxide semiconductor (CMOS), or a diode switch. Accordingly, the switch 22SW can be constituted by one FET switch or diode switch, and thus the size of the filter circuit 122A can be reduced. In other words, the size of a switch using semiconductor is small, and thus the size of the filter circuit 122A can be reduced.

In the parallel-arm circuit 120A, the frequency at which the impedance is minimum and the frequency at which the impedance is maximum are shifted to the low band side or high band side in accordance with switching between ON and OFF of the switch 22SW. This will be described below together with the bandpass characteristic of the filter circuit 122A.

In the present embodiment, the individual resonators constituting the filter circuit 122A (the series-arm resonator 22s and the parallel-arm resonators 22p1 and 22p2) are resonators that use a surface acoustic wave. Accordingly, the filter circuit 122A can be constituted by interdigital transducer (IDT) electrodes formed on a piezoelectric substrate, and thus it is possible to obtain a compact and low-profile filter circuit having a bandpass characteristic with a high degree of steepness.

The individual resonators of the filter circuit 122A need not necessarily be SAW resonators, and may be resonators that use a bulk acoustic wave (BAW). That is, it is sufficient that the individual resonators have a "resonant point", which is a singular point at which the impedance is minimum (ideally a point at which the impedance is 0), and an "anti-resonant point", which is a singular point at which the impedance is maximum (ideally a point at which the impedance is infinite).

[2.2 Bandpass Characteristic of Filter (Tunable Filter)]

Regarding the bandpass characteristic of the filter circuit 122A having the above-described configuration, switching between the first bandpass characteristic and the second bandpass characteristic is performed by switching between ON and OFF of the switch 22SW that is performed in accordance with the control signal φctrl.

First, a description will be given of the impedance characteristic of a resonator alone. Hereinafter, a singular point at which the impedance is minimum (ideally a point at which the impedance is 0) will be referred to as a "resonant point", and the frequency at the resonant point will be referred to as a "resonant frequency", not only in a resonator but also in a parallel-arm circuit for convenience. In addition, a singular point at which the impedance is maximum (ideally a point at which the impedance is infinite) will be referred to as an "anti-resonant point", and the frequency at the anti-resonant point will be referred to as an "anti-resonant frequency".

The series-arm resonator 22s, the parallel-arm resonator 22p1, and the parallel-arm resonator 22p2 have the following impedance characteristics. Specifically, the parallel-arm resonator 22p1 has a resonant frequency frp1 and an anti-resonant frequency fap1 (at this time, frp1<fap1 is satisfied). The parallel-arm resonator 22p2 has a resonant frequency frp2 and an anti-resonant frequency fap2 (at this time, frp1<frp2<fap2 is satisfied). The series-arm resonator 22s has a resonant frequency frs and an anti-resonant frequency fas (at this time, frs<fas and frp1<frs<frp2 are satisfied).

Next, a description will be given of the impedance characteristic of the parallel-arm circuit 120A.

When the switch 22SW is ON, the impedance characteristic of the parallel-arm circuit 120A is a characteristic not affected by the capacitor 22C. That is, in this state, the composite characteristics of the two parallel-arm resonators (the parallel-arm resonators 22p1 and 22p2) correspond to the impedance characteristic of the parallel-arm circuit 120A.

Specifically, when the switch 22SW is ON, the parallel-arm circuit 120A has the following impedance characteristic.

The parallel-arm circuit 120A has two resonant frequencies fr1on and fr2on (at this time, fr1on=frp1, and fr2on=frp2 are satisfied). That is, the impedance of the parallel-arm circuit 120A is minimum at (i) the resonant frequency of the parallel-arm resonator 22p1 constituting the parallel-arm circuit 120A, and (ii) a frequency higher than the resonant frequency of the parallel-arm resonator 22p2.

In addition, the parallel-arm circuit 120A has two anti-resonant frequencies fa1on and fa2on (at this time, fr1on<fa1on<fr2on<fa2on, and fa1on<fap1, and fa2on<fap2 are satisfied). That is, the impedance of the parallel-arm circuit 120A is maximum at (i) a frequency between the resonant frequencies of the parallel-arm resonators 22p1 and 22p2 constituting the parallel-arm circuit 120A, and (ii) a frequency between the anti-resonant frequencies of the two parallel-arm resonators 22p1 and 22p2.

Here, the reason fa1on<fap1 is satisfied is that, in the frequency band near the anti-resonant frequency fap1 of the parallel-arm resonator 22p1, the parallel-arm resonator 22p2 operates as a parallel capacitor with respect to the parallel-arm resonator 22p1. In addition, the reason fa2on<fap2 is satisfied is that, in the frequency band near the anti-resonant frequency fap2 of the parallel-arm resonator 22p2, the parallel-arm resonator 22p1 operates as a parallel capacitor with respect to the parallel-arm resonator 22p2.

Specifically, when the switch 22SW is ON, in the parallel-arm circuit 120A, resonance occurs between a resonator (here, the parallel-arm resonator 22p1) and a capacitor (here, the parallel-arm resonator 22p2) as the frequency increases from the resonant frequency frp1 at which the parallel-arm resonator 22p1 resonates and as the frequency becomes closer to the anti-resonant frequency fap1. That is, in a conceptual equivalent circuit of the parallel-arm circuit 120A, an LC series circuit constituting a resonator (the parallel-arm resonator 22p1) and a capacitor connected in parallel thereto resonates with a capacitor (the parallel-arm resonator 22p2) connected in parallel to the resonator. Thus, in the parallel-arm circuit 120A, the impedance is maximum (anti-resonance) at a frequency (fa1on) lower than the anti-resonant frequency fap1. With a similar mechanism, when the frequency increases from the resonant frequency frp2 and becomes closer to the anti-resonant frequency fap2, the impedance is maximum (anti-resonance) at a frequency (fa2on) lower than the anti-resonant frequency fap2.

In the case of configuring a bandpass filter using ladder resonators, the anti-resonant frequency fa1on of the parallel-arm circuit 120A and the resonant frequency frs of the series-arm resonator 22s are set to be close to each other. Accordingly, when the switch 22SW is ON, the frequencies near the resonant frequency fr1on at which the impedance of the parallel-arm circuit 120A is closer to 0 correspond to a low-frequency-side stop band. At a higher frequency, the impedance of the parallel-arm circuit 120A is higher at the frequencies near the anti-resonant frequency fa1on, and the impedance of the series-arm resonator 22s is closer to 0 at the frequencies near the resonant frequency frs. Accordingly, the frequencies near the anti-resonant frequency fa1on and the resonant frequency frs serve as a signal pass band in the signal path (series arm) from the input/output terminal 22m to the input/output terminal 22n. At a still higher frequency near the resonant frequency fr2on and the anti-resonant frequency fas, the impedance of the series-arm resonator 22s is higher and the impedance of the parallel-arm circuit 120A is closer to 0, which corresponds to a high-frequency-side stop band.

That is, when the switch 22SW is ON, the filter circuit 122A has the first bandpass characteristic in which the pass band is determined by the anti-resonant frequency fa1on and the resonant frequency frs, the pole (attenuation pole) on the low band side of the pass band is determined by the resonant frequency fr1on, and the pole (attenuation pole) on the high band side of the pass band is determined by the resonant frequency fr2on and the anti-resonant frequency fas.

The anti-resonant frequency fa2on of the parallel-arm circuit 120A does not have a great influence on the bandpass characteristic (here, first bandpass characteristic) of the filter circuit 122A because the impedance of the series-arm resonator 22s is high at the anti-resonant frequency fa2on.

On the other hand, when the switch 22SW is OFF, the impedance characteristic of the parallel-arm circuit 120A is a characteristic affected by the capacitor 22C. That is, in this state, the composite characteristics of the two parallel-arm resonators (parallel-arm resonators 22p1 and 22p2) and the capacitor 22C correspond to the impedance characteristic of the parallel-arm circuit 120A.

Specifically, when the switch 22SW is OFF, the parallel-arm circuit 120A has the following impedance characteristic.

The parallel-arm circuit 120A has two resonant frequencies fr1off and fr2off and two anti-resonant frequencies fa1off and fa2off (at this time, fr1off<fa1off<fr2off<fa2off, fa1off<fap1, frp2<fr2off, and fa2off<fap2 are satisfied). That is, the impedance of the parallel-arm circuit 120A is minimum at (i) the resonant frequency of the parallel-arm resonator 22p1 constituting the parallel-arm circuit 120A and (ii) a frequency higher than the resonant frequency of the parallel-arm resonator 22p2. In addition, the impedance of the parallel-arm circuit 120A is maximum at (i) a frequency between the resonant frequencies of the parallel-arm resonators 22p1 and 22p2 constituting the parallel-arm circuit 120A and (ii) a frequency between the anti-resonant frequencies of the two parallel-arm resonators 22p1 and 22p2.

Here, the reason fa1off<fap1 is satisfied is that, in the frequency band near the anti-resonant frequency fap1 of the parallel-arm resonator 22p1, the parallel-arm resonator 22p2 operates as a capacitor with respect to the parallel-arm resonator 22p1. In addition, the reason frp2<fr2off is satisfied is that, in the frequency band near the resonant frequency frp2 of the parallel-arm resonator 22p2, resonance occurs between the parallel-arm resonator 22p2 and the capacitor 22C. In addition, the reason fa2off<fap2 is satisfied is that, in the frequency band near the anti-resonant frequency fap2 of the parallel-arm resonator 22p2, the parallel-arm resonator 22p1 operates as a capacitor with respect to the parallel-arm resonator 22p2.

Specifically, when the switch 22SW is OFF, in the parallel-arm circuit 120A, resonance occurs between a resonator (here, the parallel-arm resonator 22p1) and a capacitor (here, the parallel-arm resonator 22p2 and the capacitor 22C) as the frequency increases from the resonant frequency frp1 at which the parallel-arm resonator 22p1 resonates and as the frequency becomes closer to the anti-resonant frequency fap1. That is, in a conceptual equivalent circuit of the parallel-arm circuit 120A, an LC series circuit constituting a resonator (the parallel-arm resonator 22p1) and a capacitor connected in parallel thereto resonates with a capacitor (the parallel-arm resonator 22p2 and the capacitor 22C) connected in parallel to the resonator. Thus, in the parallel-arm circuit 120A, the impedance is maximum (anti-resonance) at a frequency (fa1off) lower than the anti-resonant frequency fap1. With a similar mechanism, when the frequency increases from the resonant frequency frp2 and becomes closer to the anti-resonant frequency fap2, the impedance is maximum (anti-resonance) at a frequency (fa2off) lower than the anti-resonant frequency fap2. In addition, as the frequency increases from the anti-resonant frequency fa1off and becomes closer to the resonant frequency frp2, resonance occurs between the parallel-arm resonator 22p2 and the capacitor 22C. That is, in a conceptual equivalent circuit of the parallel-arm circuit 120A, an LC series circuit constituting a resonator (the parallel-arm resonator 22p2) and a capacitor connected in parallel thereto resonates with a capacitor (the capacitor 22C) connected in parallel to the resonator. Thus, in the parallel-arm circuit, the impedance is minimum (resonance) at a frequency (fr2off) higher than the resonant frequency frp2.

At this time, when the anti-resonant frequency on the low band side in a case where the switch 22SW is OFF is compared with that in a case where the switch 22SW is ON, fa1on<fa1off is satisfied. This is because, when the switch 22SW is OFF, compared with when the switch 22SW is ON, the frequency variable width from the anti-resonant frequency fap1 of the parallel-arm resonator 22p1 decreases due to the influence of the capacitor 22C.

In addition, when the resonant frequency on the high band side in a case where the switch 22SW is OFF is compared with that in a case where the switch 22SW is ON, fr2on<fr2off is satisfied. This is because, when the switch 22SW is OFF, compared with when the switch 22SW is ON, fr2on (=frp2)<fr2off is satisfied due to the influence of the capacitor 22C, as described above.

In the case of configuring a bandpass filter using ladder resonators, the anti-resonant frequency fa1off of the parallel-arm circuit 120A and the resonant frequency frs of the series-arm resonator 22s are set to be close to each other. Accordingly, when the switch 22SW is OFF, the frequencies near the resonant frequency fr1off at which the impedance of the parallel-arm circuit 120A is closer to 0 correspond to a low-frequency-side stop band. At a higher frequency, the impedance of the parallel-arm circuit 120A is higher at the frequencies near the anti-resonant frequency fa1off, and the impedance of the series-arm resonator 22s is closer to 0 at the frequencies near the resonant frequency frs. Accordingly, the frequencies near the anti-resonant frequency fa1off and the resonant frequency frs serve as a signal pass band in the signal path (series arm) from the input/output terminal 22m to the input/output terminal 22n. At a still higher frequency near the resonant frequency fr2off and the anti-resonant frequency fas, the impedance of the series-arm resonator 22s is higher and the impedance of the parallel-arm circuit 120A is closer to 0, which corresponds to a high-frequency-side stop band.

That is, when the switch 22SW is OFF, the filter circuit 122A has the second bandpass characteristic in which the pass band is determined by the anti-resonant frequency fa1off and the resonant frequency frs, the pole (attenuation pole) on the low band side of the pass band is determined by the resonant frequency fr1off, and the pole (attenuation pole) on the high band side of the pass band is determined by the resonant frequency fr2off and the anti-resonant frequency fas.

The anti-resonant frequency fa2off of the parallel-arm circuit does not have a great influence on the bandpass characteristic (here, second bandpass characteristic) of the filter circuit 122A because the impedance of the series-arm resonator 22s is high at the anti-resonant frequency fa2off, like the above-described anti-resonant frequency fa2on.

With the above-described impedance characteristic, when the switch 22SW is switched from ON to OFF, the impedance characteristic of the parallel-arm circuit 120A is changed in the following manner. That is, in the parallel-arm circuit 120A, the resonant frequency on the high band side among the two resonant frequencies, and the anti-resonant frequency on the low band side among the two anti-resonant frequencies are shifted to the high band side. In the present embodiment, only the parallel-arm resonator 22p2 is connected in series to the capacitor 22C and the switch 22SW, and thus the resonant frequency on the high band side of the two resonant frequencies is shifted to the high band side from fr2on to fr2off. Also, the anti-resonant frequency on the low band side is shifted to the high band side from fa1on to fa1off.

Here, the anti-resonant point on the low band side and the resonant point on the high band side of the parallel-arm circuit 120A determine the attenuation slope on the high band side of the pass band of the filter circuit 122A, and both the points are shifted to the high band side, as described above. Thus, when the switch 22SW is switched from ON to OFF, in the bandpass characteristic of the filter circuit 122A, the attenuation slope on the high band side of the pass band is shifted to the high band side while maintaining steepness. In other words, the filter circuit 122A is able to shift the attenuation pole on the high band side of the pass band to the high band side and also to shift the higher end of the pass band to the high band side while suppressing an increase in insertion loss at the higher end of the pass band.

That is, in the filter circuit 122A, the attenuation pole on the low band side of the pass band is formed by the resonant frequency on the low frequency side of the parallel-arm circuit 120A, the attenuation pole on the high band side of the pass band is formed by the resonant frequency on the high frequency side of the parallel-arm circuit 120A, and the pass band is formed by the anti-resonant frequency on the low frequency side of the parallel-arm circuit 120A and the resonant frequency of the series-arm circuit (here, the series-arm resonator 22s).

In the filter circuit 122A, with the above-described configuration of the parallel-arm circuit 120A, switching between ON and OFF of the switch 22SW enables at least one resonant frequency among the at least two resonant frequencies and at least one anti-resonant frequency among the at least two anti-resonant frequencies in the parallel-arm circuit 120A to be shifted to the low frequency side or high frequency side. Thus, the frequency at the end of the pass band and the frequency at the attenuation pole can be shifted to the low frequency side or high frequency side. Thus, in the filter circuit 122A, the frequencies of the pass band and the attenuation band can be switched while suppressing an increase in insertion loss at the end of the pass band.

Specifically, the resonant frequency of the parallel-arm resonator 22p1 is lower than the resonant frequency of the parallel-arm resonator 22p2, and the anti-resonant frequency of the parallel-arm resonator 22p1 is lower than the anti-resonant frequency of the parallel-arm resonator 22p2. In addition, the first circuit 10a does not include the frequency variable circuit 22T, whereas the second circuit 20a includes the frequency variable circuit 22T.

With this configuration, switching between ON and OFF of the switch 22SW enables the resonant frequency on the high frequency side among the at least two resonant frequencies and the anti-resonant frequency on the low frequency side among the at least two anti-resonant frequencies in the parallel-arm circuit 120A to be shifted to the low frequency side or high frequency side. Thus, the frequency at the higher end of the pass band and the frequency at the attenuation pole on the high band side of the pass band can be shifted to the low frequency side or high frequency side. Thus, in the filter circuit 122A, the frequency at the higher end of the pass band and the frequency at the attenuation pole on the high band side of the pass band can be switched while suppressing an increase in insertion loss at the higher end of the pass band.

[2.3 First Modification Example of Filter (Tunable Filter)]

A description has been given so far of a filter in which only the parallel-arm resonator 22p2 among the parallel-arm resonators 22p1 and 22p2 is connected in series to the capacitor 22C and the switch 22SW, so that the attenuation slope on the high band side of the pass band is shifted to switch the frequencies of the pass band or the frequency of at least one attenuation pole. A similar technique is applicable to a filter that shifts the attenuation slope on the low band side of the pass band to switch the frequencies of the pass band or the frequency of at least one attenuation pole. Hereinafter, such a filter will be described as a filter according to a first modification example of the second embodiment.

Figure 14B:
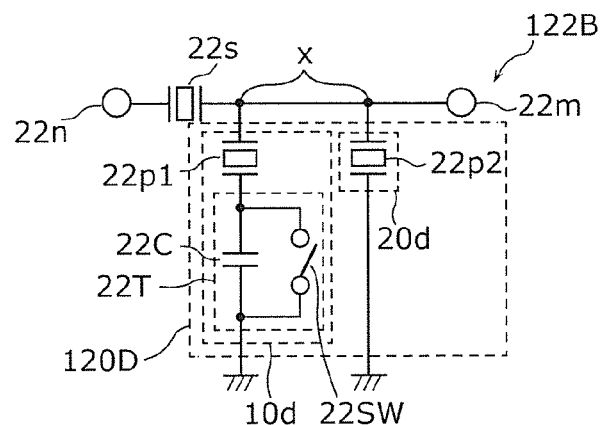
FIG. 14B is a circuit configuration diagram of a filter circuit according to a first modification example of the second embodiment.

FIG. 14B is a circuit configuration diagram of a filter circuit 122B according to the first modification example of the second embodiment. The filter circuit 122B illustrated in FIG. 14B is different from the filter circuit 122A illustrated in FIG. 14A in that the capacitor 22C and the switch 22SW are connected in series to only the parallel-arm resonator 22p1. That is, in the present modification example, only the parallel-arm resonator 22p1 among the parallel-arm resonators 22p1 and 22p2 is connected in series to the frequency variable circuit 22T. In other words, in the present modification example, a first circuit 10d includes the frequency variable circuit 22T, whereas a second circuit 20d does not include the frequency variable circuit 22T and is constituted by only the parallel-arm resonator 22p2.

Hereinafter, a description will be given mainly of a difference from the filter circuit 122A according to the second embodiment, and a description of the same point will be omitted.

In the present modification example, the capacitor 22C and the switch 22SW are connected in series to the parallel-arm resonator 22p1 between the node x and the ground, specifically, connected in series between the ground and the parallel-arm resonator 22p1. The capacitor 22C and the switch 22SW may be connected in series between the node x and the parallel-arm resonator 22p1.

In the present modification example, the capacitor 22C is an impedance element connected in series to the parallel-arm resonator 22p1. The frequency variable width of the pass band of the filter circuit 122B depends on the element value of the capacitor 22C, for example, the frequency variable width increases as the element value of the capacitor 22C decreases. Thus, the element value of the capacitor 22C may be appropriately determined in accordance with the frequency specifications required for the filter circuit 122B.

In the present modification example, the parallel-arm resonators 22p1 and 22p2, the capacitor 22C, and the switch 22SW constitute a parallel-arm circuit 120D connected between the ground and the node on the path that connects the input/output terminal 22m and the input/output terminal 22n.

Regarding the bandpass characteristic of the filter circuit 122B having the above-described configuration, switching between the first bandpass characteristic and the second bandpass characteristic is performed by switching between ON and OFF of the switch 22SW that is performed in accordance with a control signal.

Here, the impedance characteristic of a resonator alone is similar to the characteristics described above regarding the filter circuit 122A. Thus, hereinafter, the description thereof will be omitted and a description will be given mainly of the impedance characteristic of the parallel-arm circuit 120D.

When the switch 22SW is ON, the impedance characteristic of the parallel-arm circuit 120D is a characteristic not affected by the capacitor 22C. That is, in this state, the composite characteristics of the two parallel-arm resonators (parallel-arm resonators 22p1 and 22p2) correspond to the impedance characteristic of the parallel-arm circuit 120D, like the characteristics described above regarding the filter circuit 122A.

That is, when the switch 22SW is ON, the filter circuit 122B has the first bandpass characteristic similar to that of the filter circuit 122A.

On the other hand, when the switch 22SW is OFF, the impedance characteristic of the parallel-arm circuit 120D is a characteristic affected by the capacitor 22C. That is, in this state, the composite characteristics of the two parallel-arm resonators (parallel-arm resonators 22p1 and 22p2) and the capacitor 22C correspond to the impedance characteristic of the parallel-arm circuit 120D.

Specifically, when the switch 22SW is OFF, the parallel-arm circuit 120D has the following impedance characteristic.

The parallel-arm circuit 120D has two resonant frequencies fr1off and fr2off and two anti-resonant frequencies fa1off and fa2off (at this time, fr1off<fa1off<fr2off<fa2off, fa1off<fap1, frp1<frp1off, and fa2off<fap2 are satisfied). That is, the impedance of the parallel-arm circuit 120D is minimum at (i) a frequency higher than the resonant frequency frp1 of the parallel-arm resonator 22p1 constituting the parallel-arm circuit 120D, and (ii) the resonant frequency frp2 of the parallel-arm resonator 22p2. In addition, the impedance of the parallel-arm circuit 120D is maximum at (i) a frequency between the resonant frequency frp1 of the parallel-arm resonator 22p1 and the resonant frequency frp1 of the parallel-arm resonator 22p2 constituting the parallel-arm circuit 120D, and (ii) a frequency between the anti-resonant frequency fap1 of the parallel-arm resonator 22p1 and the anti-resonant frequency fap2 of the parallel-arm resonator 22p2.

Here, the reason fa1off<fap1 is satisfied is that, in the frequency band near the anti-resonant frequency fap1 of the parallel-arm resonator 22p2, the parallel-arm resonator 22p2 operates as a parallel capacitor with respect to the parallel-arm resonator 22p1. In addition, the reason frp1<fr1off is satisfied is that, in the frequency band near the resonant frequency frp1 of the parallel-arm resonator 22p1, resonance occurs between the parallel-arm resonator 22p1 and the capacitor 22C. In addition, the reason fa2off<fap2 is satisfied is that composite characteristics of the parallel-arm resonator 22p1 and the capacitor 22C operate as a parallel capacitor with respect to the parallel-arm resonator 22p2.

A specific mechanism is similar to that in the case of the above-described parallel-arm circuit 120A except that the component operating as a resonator and a component operating as a capacitor are interchanged between the parallel-arm resonator 22p1 and the parallel-arm resonator 22p2, and thus the description thereof is omitted.

That is, when the switch 22SW is OFF, the filter circuit 122B has the second bandpass characteristic in which the pass band is determined by the anti-resonant frequency fa1off and the resonant frequency frs, the pole (attenuation pole) on the low band side of the pass band is determined by the resonant frequency fr1off, and the pole (attenuation pole) on the high band side of the pass band is determined by the resonant frequency fr2off and the anti-resonant frequency fas.

When the switch 22SW is switched from ON to OFF, the impedance characteristic of the parallel-arm circuit 120D is changed in the following manner. That is, in the parallel-arm circuit 120D, the resonant frequency on the low band side among the two resonant frequencies, and the anti-resonant frequency on the low band side among the two anti-resonant frequencies are shifted to the high band side. In the present modification example, only the parallel-arm resonator 22p1 is connected in series to the capacitor 22C and the switch 22SW, and thus the resonant frequency on the low band side of the two resonant frequencies is shifted to the high band side from fr1on to fr1off. Also, the anti-resonant frequency on the low band side is shifted to the high band side from fa1on to fa1off.

Here, the anti-resonant point on the low band side and the resonant point on the low band side of the parallel-arm circuit 120D determine the attenuation slope on the low band side of the pass band of the filter circuit 122B, and both the points are shifted to the high band side, as described above. Thus, when the switch 22SW is switched from ON to OFF, in the bandpass characteristic of the filter circuit 122B, the attenuation slope on the low band side of the pass band is shifted to the high band side while maintaining steepness. In other words, the filter circuit 122B is able to shift the attenuation pole on the low band side of the pass band to the high band side and also to shift the lower end of the pass band to the high band side while suppressing an increase in insertion loss at the lower end of the pass band.

That is, in the filter circuit 122B according to the present modification example, as in the above-described filter circuit 122A, the frequencies of the pass band and the attenuation band can be switched while suppressing an increase in insertion loss at the end of the pass band.

Specifically, the resonant frequency of the parallel-arm resonator 22p1 is lower than the resonant frequency of the parallel-arm resonator 22p2, and the anti-resonant frequency of the parallel-arm resonator 22p1 is lower than the anti-resonant frequency of the parallel-arm resonator 22p2. In addition, the first circuit 10d includes the frequency variable circuit 22T, whereas the second circuit 20d does not include the frequency variable circuit 22T.

With this configuration, switching between ON and OFF of the switch 22SW enables the resonant frequency on the low frequency side among the at least two resonant frequencies and the anti-resonant frequency on the low frequency side among the at least two anti-resonant frequencies in the parallel-arm circuit 120D to be shifted to the low frequency side or high frequency side. Thus, the frequency at the lower end of the pass band and the frequency at the attenuation pole on the low band side of the pass band can be shifted to the low frequency side or high frequency side. Thus, in the filter circuit 122B, the frequency at the lower end of the pass band and the frequency at the attenuation pole on the low band side of the pass band can be switched while suppressing an increase in insertion loss at the lower end of the pass band.

[2.4 Second Modification Example of Filter (Tunable Filter)]

In a filter capable of switching the frequencies of the pass band or the frequency of at least one attenuation pole, the attenuation slopes on the high band side and low band side of the pass band may be shifted. Hereinafter, such a filter will be described as a filter according to a second modification example of the second embodiment.

Figure 14C:
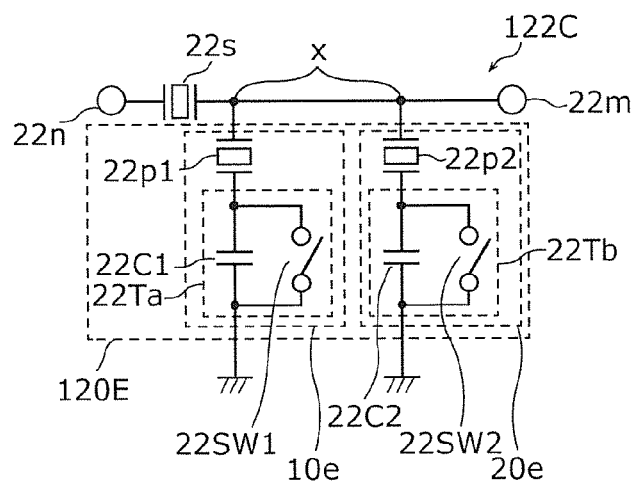
FIG. 14C is a circuit configuration diagram of a filter circuit according to a second modification example of the second embodiment.

FIG. 14C is a circuit configuration diagram of a filter circuit 122C according to the second modification example of the second embodiment. The filter circuit 122C illustrated in FIG. 14C is different from the filter circuit 122A illustrated in FIG. 14A and the filter circuit 122B illustrated in FIG. 14B in that capacitors 22C1 and 22C2 and switches 22SW1 and 22SW2 are provided for the two parallel-arm resonators 22p1 and 22p2, respectively, and are connected in series to the corresponding parallel-arm resonators 22p1 and 22p2.

That is, a parallel-arm circuit 120E includes the capacitor 22C1 (impedance element) and the switch 22SW1 (first switch element) that are connected in series to one of the parallel-arm resonators 22p1 and 22p2 (one of the first and second parallel-arm resonators, here, the parallel-arm resonator 22p1) and that are connected in parallel to each other. Furthermore, the parallel-arm circuit 120E includes the capacitor 22C2 (impedance element) and the switch 22SW2 (first switch element) that are connected in series to the other of the parallel-arm resonators 22p1 and 22p2 (the other of the first and second parallel-arm resonators, here, the parallel-arm resonator 22p2) and that are connected in parallel to each other.

Here, the capacitor 22C1 and the switch 22SW1 in the present modification example correspond to the capacitor 22C and the switch 22SW of the above-described filter circuit 122A. Thus, the capacitor 22C1 and the switch 22SW1 constitute a frequency variable circuit 22Ta corresponding to the frequency variable circuit 22T in the filter circuit 122B.

Thus, in the present modification example, each of a first circuit 10e and a second circuit 20e includes a frequency variable circuit. Specifically, the first circuit 10e includes the frequency variable circuit 22Ta, whereas the second circuit 20e includes a frequency variable circuit 22Tb. The first circuit 10e corresponds to the first circuit 10d in the filter circuit 122B, and the second circuit 20e corresponds to the second circuit 20a in the filter circuit 122A. Thus, a detailed description of the first circuit 10e and the second circuit 20e is omitted.

Regarding the bandpass characteristic of the filter circuit 122C having the above-described configuration, switching between the first bandpass characteristic and the second bandpass characteristic is performed by switching between ON and OFF of the switches 22SW1 and 22SW2 that is performed in accordance with a control signal.

When both the switches 22SW1 and 22SW2 are ON, the impedance characteristic of the parallel-arm circuit 120E is a characteristic not affected by the capacitors 22C1 and 22C2. That is, in this state, the composite characteristics of the two parallel-arm resonators (parallel-arm resonators 22p1 and 22p2) correspond to the impedance characteristic of the parallel-arm circuit 120E, like the characteristics described above regarding the filter circuit 122A.

That is, when both the switches 22SW1 and 22SW2 are ON, the filter circuit 122C has the first bandpass characteristic similar to that when the switch 22SW of the filter circuit 122A is ON and when the switch 22SW of the filter circuit 122B is ON.

On the other hand, when both the switches 22SW1 and 22SW2 are OFF, the impedance characteristic of the parallel-arm circuit 120E is a characteristic affected by the capacitors 22C1 and 22C2. That is, in this state, the composite characteristics of the two parallel-arm resonators (parallel-arm resonators 22p1 and 22p2) and the capacitors 22C1 and 22C2 correspond to the impedance characteristic of the parallel-arm circuit 120E.

Specifically, when both the switches 22SW1 and 22SW2 are OFF, the parallel-arm circuit 120E has the following impedance characteristic.

The parallel-arm circuit 120E has two resonant frequencies fr1off and fr2off and two anti-resonant frequencies fa1off and fa2off (at this time, fr1off<fa1off<fr2off<fa2off, fa1off<fap1, frp1<frp1off, frp2<frp2off, and fa2off<fap2 are satisfied). That is, the impedance of the parallel-arm circuit 120E is minimum at (i) a frequency higher than the resonant frequency of the parallel-arm resonator 22p1 constituting the parallel-arm circuit 120E, and (ii) a frequency higher than the resonant frequency of the parallel-arm resonator 22p2. In addition, the impedance of the parallel-arm circuit 120E is maximum at (i) a frequency between the resonant frequencies of the parallel-arm resonators 22p1 and 22p2 constituting the parallel-arm circuit 120E, and (ii) a frequency between the anti-resonant frequencies of the two parallel-arm resonators 22p1 and 22p2.

The reason for this and its specific mechanism are similar to those in the case of the above-described parallel-arm circuits 120A and 120D, and thus the description thereof is omitted.

That is, when the switch 22SW is OFF, the filter circuit 122C has the second bandpass characteristic in which the pass band is determined by the anti-resonant frequency fa1off and the resonant frequency frs, the pole (attenuation pole) on the low band side of the pass band is determined by the resonant frequency fr1off, and the pole (attenuation pole) on the high band side of the pass band is determined by the resonant frequency fr2off and the anti-resonant frequency fas.

When both the switches 22SW1 and 22SW2 are switched from ON to OFF, the impedance characteristic of the parallel-arm circuit 120E is changed in the following manner. That is, in the parallel-arm circuit 120E, both the two resonant frequencies and the anti-resonant frequency on the low band side among the two anti-resonant frequencies are shifted to the high band side. In the modification example, the parallel-arm resonators 22p1 and 22p2 are connected in series to the capacitors 22C1 and 22C2, respectively, and thus both the two resonant frequencies are shifted to the high band side. Also, the anti-resonant frequency on the low band side is shifted to the high band side.

Here, the anti-resonant point on the low band side and the resonant point on the high band side of the parallel-arm circuit determine the attenuation slope on the high band side of the pass band of the filter circuit 122C, and both the points are shifted to the high band side, as described above. Also, the anti-resonant point on the low band side and the resonant point on the low band side of the parallel-arm circuit determine the attenuation slope on the low band side of the pass band of the filter circuit 122C, and both the points are shifted to the high band side, as described above. Thus, when both the switches 22SW1 and 22SW2 are switched from ON to OFF, in the bandpass characteristic of the filter circuit 122C, the attenuation slopes on the high band side and low band side of the pass band are shifted to the high band side while maintaining steepness. In other words, the filter circuit 122C is able to shift the attenuation poles on the high band side and low band side of the pass band to the high band side and also to shift the higher end and lower end of the pass band to the high band side while suppressing an increase in insertion loss at the higher end and lower end of the pass band. Accordingly, for example, the filter circuit 122C is able to shift the center frequency while maintaining a band width.

The filter circuit 122C need not necessarily turn both the switches 22SW1 and 22SW2 ON or OFF, and may separately turn them ON or OFF. Note that, in the case of turning both the switches 22SW1 and 22SW2 ON or OFF, the number of control lines for controlling the switches 22SW1 and 22SW2 can be reduced, and thus the configuration of the filter circuit 122C can be simplified.

On the other hand, in the case of separately turning them ON or OFF, it is possible to increase the variations of the pass band that is switchable by the filter circuit 122C.

Specifically, as described above regarding the filter circuit 122A, the higher end of the pass band can be changed in accordance with switching between ON and OFF of the switch 22SW1 connected in series to the parallel-arm resonator 22$p$1 (first parallel-arm resonator). Also, as described above regarding the filter circuit 122B, the lower end of the pass band can be changed in accordance with switching between ON and OFF of the switch 22SW2 connected in series to the parallel-arm resonator 22$p$2 (second parallel-arm resonator).

Thus, by turning both the switches 22SW1 and 22SW2 ON or OFF, the lower end and higher end of the pass band can be shifted to the low band side or high band side. That is, the center frequency of the pass band can be shifted to the low band side or high band side. In addition, by turning one of the switches 22SW1 and 22SW2 from ON to OFF and by turning the other from OFF to ON, both the lower end and higher end of the pass band can be shifted so that the difference in frequency therebetween increases or decreases. That is, the pass band width can be changed with the center frequency of the pass band being kept almost constant. In addition, by turning one of the switches 22SW1 and 22SW2 ON or OFF with the other being ON or OFF, one of the lower end and higher end of the pass band can be shifted to the low band side or high band side, with the other being fixed. That is, the lower end or higher end of the pass band can be changed.

In this way, with the capacitors 22C1 and 22C2 and the switches 22SW1 and 22SW2, the degree of freedom of changing the pass band can be increased.

That is, in the filter circuit 122C according to the present modification example, as in the above-described filter circuits 122A and 122B, the frequencies of the pass band and the attenuation band can be switched while suppressing an increase in insertion loss at the end of the pass band.

Specifically, the resonant frequency of the parallel-arm resonator 22$p$1 is lower than the resonant frequency of the parallel-arm resonator 22$p$2, and the anti-resonant frequency of the parallel-arm resonator 22$p$1 is lower than the anti-resonant frequency of the parallel-arm resonator 22$p$2. In addition, each of the first circuit 10$e$ and the second circuit 20$e$ includes a frequency variable circuit (the first circuit 10$e$ includes the frequency variable circuit 22Ta, and the second circuit 20$e$ includes the frequency variable circuit 22Tb).

Accordingly, switching between ON and OFF of the switch 22SW2 in the second circuit 20$e$ enables switching of the frequency at the higher end of the pass band and the attenuation pole on the high band side of the pass band, and switching between ON and OFF of the switch 22SW1 in the first circuit 10$e$ enables switching of the frequency at the lower end of the pass band and the attenuation pole on the low band side of the pass band. Thus, in the filter circuit 122C, it is possible to switch both the frequencies at the lower end of the pass band and at the attenuation pole on the low band side of the pass band, and frequencies at the higher end of the pass band and at the attenuation pole on the high band side of the pass band, while suppressing an increase in insertion loss at the end of the pass band.

[2.5 Advantages and the Like]

As described above, each of the filter circuits 122A, 122B, and 122C (RF filter circuits) according to the present embodiment and its first and second modification examples includes the series-arm resonator 22$s$ and the parallel-arm circuit (the parallel-arm circuit 120A, 120D, or 120E), and has first and second bandpass characteristics with different pass bands, switching therebetween being performed in accordance with switching between ON and OFF of the switch 22SW (first switch element). Specifically, when the switch 22SW is ON, the first bandpass characteristic is defined by the impedance that is not affected by the capacitor 22C (impedance element). On the other hand, when the switch 22SW is OFF, the second bandpass characteristic different from the first bandpass characteristic is defined by the impedance that is affected by the capacitor 22C. Here, in the parallel-arm circuits (the parallel-arm circuits 120A, 120D, and 120E), at least one frequency at which the impedance is minimum and at least one frequency at which the impedance is maximum are shifted to the low frequency side or high frequency side in accordance with switching between ON and OFF of the switch 22SW. Thus, in the first bandpass characteristic and the second bandpass characteristic, the attenuation slope determined by the frequency at which the impedance of the parallel-arm circuit is minimum and the frequency at which the frequency is maximum is shifted to the low frequency side or high frequency side while maintaining steepness. Thus, in the filter circuits 122A, 122B, and 122C according to the present embodiment and its first and second modification examples, it is possible to switch the frequencies of the pass band or the frequency of at least one attenuation pole while suppressing an increase in loss at the frequency at the end of the pass band.

In addition, in the filter circuit 122A according to the present embodiment, only the parallel-arm resonator 22$p$2 (second parallel-arm resonator) is connected in series to the capacitor 22C and the switch 22SW, and thus the higher end of the pass band can be changed. Specifically, when the switch 22SW is ON, the parallel-arm circuit 120A has two points (here, fr1on and fr2on) which reflect the resonant frequencies of the parallel-arm resonators 22*p*1 and 22*p*2 (first and second parallel-arm resonators) and at which the impedance is minimum, and a point (here, fa1on) therebetween at which the impedance is maximum. On the other hand, when the switch 22SW is OFF, in the parallel-arm circuit 120A, only the parallel-arm resonator 22*p*2 is connected in series to the capacitor 22C, and thus the point (here, fr2off) on the high band side among the two points at which the impedance is minimum and the point (here, fa1off) at which the impedance is maximum are shifted to the high band side. Accordingly, in the second bandpass characteristic, compared with the first bandpass characteristic, the attenuation slope on the high band side determined by the frequency on the high band side at which the impedance of the parallel-arm circuit 120A is minimum and the frequency at which the impedance is maximum is shifted to the high band side. Thus, in the filter circuit 122A according to the present embodiment, the higher end of the pass band can be changed while suppressing an increase in loss at the frequency at the higher end of the pass band.

In the filter circuit 122B according to the first modification example of the present embodiment, only the parallel-arm resonator 22*p*1 (first parallel-arm resonator) is connected in series to the capacitor 22C and the switch 22SW, and thus the lower end of the pass band can be changed. Specifically, when the switch 22SW is ON, the parallel-arm circuit 120D has two points (here, fr1on and fr2on) which reflect the resonant frequencies of the parallel-arm resonators 22*p*1 and 22*p*2 (first and second parallel-arm resonators) and at which the impedance is minimum, and a point (here, fa1on) therebetween at which the impedance is maximum. On the other hand, when the switch 22SW is OFF, in the parallel-arm circuit 120A, only the parallel-arm resonator 22*p*1 is connected in series to the capacitor 22C, and thus the point (here, fr1off) on the low band side among the two points at which the impedance is minimum and the point (here, fa1off) at which the impedance is maximum are shifted to the high band side. Accordingly, in the second bandpass characteristic, compared with the first bandpass characteristic, the attenuation slope on the low band side determined by the frequency on the low band side at which the impedance of the parallel-arm circuit 120A is minimum and the frequency at which the impedance is maximum is shifted to the high band side. Thus, in the filter circuit 122B according to the first modification example of the present embodiment, the lower end of the pass band can be changed while suppressing an increase in loss at the frequency at the lower end of the pass band.

In addition, in the filter circuit 122C according to the second modification example of the present embodiment, the parallel-arm resonators 22*p*1 and 22*p*2 (first and second parallel-arm resonators) are connected in series to the corresponding capacitors 22C1 and 22C2 (impedance elements) and the corresponding switches 22SW1 and 22SW2 (first switch elements), respectively, and thus the lower end and higher end of the pass band can be changed while suppressing an increase in loss at the frequency at the end of the pass band. Thus, in the filter circuit 122C according to the second modification example of the present embodiment, it is possible to perform either or both of the change of the center frequency of the pass band and the change of the pass band width.

In addition, in the filter circuits 122A, 122B, 122C according to the present embodiment and its first and second modification examples, the resonant frequency of the parallel-arm resonator 22*p*1 (first parallel-arm resonator) is lower than the resonant frequency of the series-arm resonator 22*s*, and thus a bandpass filter can be formed.

In addition, in the filter circuits 122A, 122B, and 122C according to the present embodiment and its first and second modification examples, it is preferable that each of the series-arm resonator 22*s* and the parallel-arm resonators 22*p*1 and 22*p*2 be either of a SAW filter and an elastic wave filter using a bulk acoustic wave (BAW). Accordingly, the sizes of the series-arm resonator 22*s* and the parallel-arm resonators 22*p*1 and 22*p*2 can be reduced, and thus the sizes and costs of the filter circuits 122A, 122B, and 122C can be reduced. In addition, the SAW filter and the elastic wave filter using BAW typically have a high Q characteristic (characteristic with a large Q value), and thus loss can be decreased and the degree of freedom for the selection can be increased.

In addition, in the filter circuits 122A, 122B, and 122C according to the present embodiment and its first and second modification examples, it is preferable that the switch 22SW (first switch element) be a FET switch made of GaAs or CMOS or a diode switch. Accordingly, the size of the switch 22SW can be reduced, and thus the sizes and costs of the filter circuits 122A, 122B, and 122C can be reduced.

In addition, in the filter circuits 122A, 122B, and 122C according to the present embodiment and its first and second modification examples, it is preferable that the capacitor 22C (impedance element) be a variable capacitor. Accordingly, the frequency variable width can be finely adjusted.

In the second embodiment and its first and second modification examples, a capacitor is described as an example of the impedance element that is connected in series to at least one of the parallel-arm resonators 22*p*1 and 22*p*2 (first and second parallel-arm resonators) and that is connected in parallel to the switch 22SW. However, such an impedance element is not limited to a capacitor and may be an inductor.

In such a filter circuit, the frequency variable width of the pass band depends on the element value of an inductor. For example, the frequency variable width increases as the element value of the inductor increases. Thus, the element value of the inductor may be appropriately determined in accordance with the frequency specifications required for the filter circuit. In addition, the inductor may be a variable inductor using micro electro mechanical systems (MEMS). Accordingly, the frequency variable width can be finely adjusted.

In the filter circuit having such a configuration, compared with the filter circuit 122A, the shift direction of the attenuation slope when switching between ON and OFF of the switch 22SW is performed is different. Specifically, in the second bandpass characteristic, which is the characteristic when the switch 22SW is OFF, compared with the first bandpass characteristic, which is the characteristic when the switch 22SW is ON, the attenuation slope is shifted to the low band side. With this configuration, the higher end of the pass band can be changed while suppressing an increase in loss at the frequency at the end of the pass band.

In the first and second modification examples of the second embodiment, an inductor may be provided instead of the capacitor. Alternatively, in the second modification example of the second embodiment, an inductor may be provided instead of one of the two capacitors 22C1 and 22C2.

In addition, a similar technique is applicable to a ladder filter structure having a plurality of stages. Specifically, in the filter structure having a plurality of stages, each of the parallel-arm circuits constituting two or more stages of the filter structure includes a first parallel-arm resonator, a second parallel-arm resonator, and a first switch element.

Accordingly, the bandpass characteristic of the entire filter circuit can be adjusted more finely, and thus ON or OFF of the first switch element is appropriately selected and switching to an appropriate band can be performed. In addition, with the filter structure having a plurality of stages, attenuation (attenuation in the stop band) can be increased.

The number of stages in the filter circuit is not limited to three, and may be two or four or more.

Alternatively, the parallel-arm circuits in all the stages of the filter circuit may have a configuration similar to that of the parallel-arm circuit according to the second embodiment. At this time, the parallel-arm circuits in all the stages may have the same configuration (for example, a configuration similar to that of the parallel-arm circuit 120E), or the parallel-arm circuit in one stage may have a configuration different from the configuration of the parallel-arm circuit in another stage (for example, a configuration similar to that of the parallel-arm circuit 120D).

In addition, a similar technique is applicable to a filter having a longitudinally coupled filter structure. That is, the filter circuit may have a combined configuration including the ladder filter structure according to the second embodiment and a longitudinally coupled resonator.

Here, the longitudinally coupled resonator is a longitudinally coupled filter circuit disposed between the input/output terminal 22m and the input/output terminal 22n, and is constituted by, for example, three IDTs and reflectors disposed on both side of the IDTs. The position where the longitudinally coupled resonator 250 is disposed may be near the input/output terminal 22m of the ladder filter structure or may be near the input/output terminal 22n of the ladder filter structure.

The filter circuit having the above-described configuration, added with the longitudinally coupled resonator, is adaptable to required filter characteristics, such as increased attenuation.

Third Embodiment

In a tunable filter circuit, the frequency variable width (an amount of shift in frequency) of the pass band is restricted by the element value of an impedance element that is connected to or disconnected from a parallel-arm resonator in accordance with switching between ON and OFF of a switch. To increase the frequency variable width, a plurality of impedance elements may be provided, and switches for selectively connecting the plurality of impedance elements and the parallel-arm resonator may be provided. However, such a configuration with an increased number of switches may produce another problem that a decrease in the size of the RF filter circuit is hindered.

Accordingly, an RF filter circuit according to the present embodiment includes a series-arm resonator connected between a first input/output terminal and a second input/output terminal, a parallel-arm resonator connected between the ground and a node on a path that connects the first input/output terminal and the second input/output terminal, a first impedance element that is one of an inductor and a capacitor and that is connected in series to the parallel-arm resonator between the node and the ground, a second impedance element that is the other of the inductor and the capacitor, and a switch element connected in series to the second impedance element. Here, a first series circuit constituted by the second impedance element and the first switch element is connected in parallel to the first impedance element.

[3.1 Configuration of Filter (Tunable Filter)]

Figure 15A:
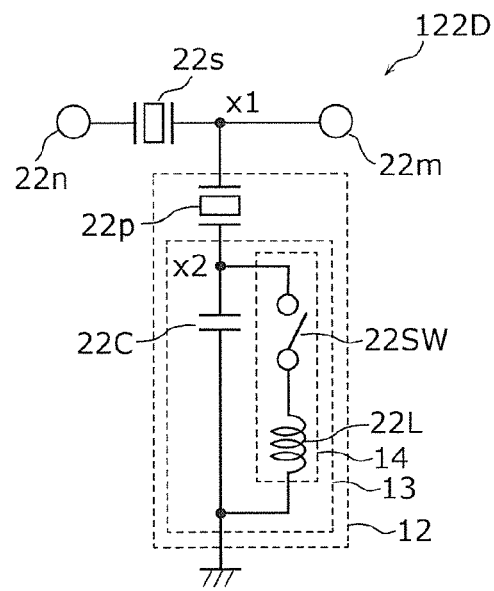
FIG. 15A is a circuit configuration diagram of a filter circuit according to a third embodiment.

FIG. 15A is a circuit configuration diagram of a filter circuit 122D according to the third embodiment. The filter circuit 122D illustrated in FIG. 15A includes the series-arm resonator 22s, a parallel-arm resonator 22p, the switch 22SW, the capacitor 22C, and an inductor 22L.

The series-arm resonator 22s is connected between the input/output terminal 22m (first input/output terminal) and the input/output terminal 22n (second input/output terminal). That is, the series-arm resonator 22s is a resonator provided on a series arm that connects the input/output terminal 22m and the input/output terminal 22n. In the present embodiment, the series-arm resonator 22s constitutes a series-arm circuit connected between the input/output terminal 22m (first input/output terminal) and the input/output terminal 22n (second input/output terminal).

The parallel-arm resonator 22p is connected between the ground (reference terminal) and a node (in FIG. 15A, node x1) on the path that connects the input/output terminal 22m and the input/output terminal 22n. That is, the parallel-arm resonator 22p is a resonator provided on a parallel arm that connects the series arm and the ground.

The capacitor 22C is a first impedance element connected in series to the parallel-arm resonator 22p between the parallel-arm resonator 22p and the ground. That is, the capacitor 22C has one terminal connected to the ground-side terminal of the parallel-arm resonator 22p and the other terminal connected to the ground.

The switch 22SW is a first switch element of a single pole single throw (SPST) type, for example, having one terminal connected to a connection node (in FIG. 15A, node x2) between the parallel-arm resonator 22p and the capacitor 22C (first impedance element) and the other terminal connected to one terminal of the inductor 22L (second impedance element). The switch 22SW connects or disconnects the connection node and the inductor 22L in accordance with switching between ON and OFF caused by the control signal ϕctrl from the controller 27.

For example, the switch 22SW may be a field effect transistor (FET) switch made of GaAs or a complementary metal oxide semiconductor (CMOS), or a diode switch. Accordingly, the switch 22SW can be constituted by one FET switch or diode switch, and thus the size of the filter circuit 122D can be reduced.

The inductor 22L is a second impedance element having one terminal connected to the other terminal of the switch 22SW and the other terminal connected to the ground.

That is, the switch 22SW and the inductor 22L are connected in parallel to the capacitor 22C while being connected in series to each other. Thus, the parallel-arm resonator 22p is connected in series to the capacitor 22C when the switch 22SW is OFF, and is connected in series to an LC parallel resonant circuit constituted by the capacitor 22C and the inductor 22L when the switch 22SW is ON.

Here, the frequency variable width of the pass band of the filter circuit 122D depends on the element values of the capacitor 22C and the inductor 22L. For example, the frequency variable width increases on the high band side as the element value of the capacitor 22C decreases, and the frequency variable width increases on the low band side as the element value of the inductor 22L increases. Thus, the element values of the capacitor 22C and the inductor 22L may be appropriately determined in accordance with the frequency specifications required for the filter circuit 122D.

In addition, the capacitor 22C may be a variable capacitor, such as a varicap or a digitally tunable capacitor (DTC). In addition, the inductor 22L may be a variable inductor using micro electro mechanical systems (MEMS). Accordingly, the frequency variable width can be finely adjusted. One of the capacitor 22C and the inductor 22L may be a variable impedance element (variable capacitor or variable inductor).

The parallel-arm resonator 22p, the capacitor 22C, the switch 22SW, and the inductor 22L constitute a parallel-arm circuit 12 connected to the ground and the node x1 on the path (on the series arm) that connects the input/output terminal 22m and the input/output terminal 22n. That is, the parallel-arm circuit 12 is provided on one parallel arm that connects the series arm and the ground, and is constituted by the parallel-arm resonator 22p connected to the node x1 on the series arm, and the impedance element, the switch element, and the like connected to the series arm with the parallel-arm resonator 22p interposed therebetween.

In other words, the parallel-arm circuit 12 includes the parallel-arm resonator 22p and an impedance circuit 13 connected in series to the parallel-arm resonator 22p. Here, the impedance circuit 13 includes the capacitor 22C, which is a first impedance element which is one of an inductor and a capacitor, the inductor 22L, which is a second impedance element which is the other of the inductor and the capacitor, and the switch 22SW connected in series to the inductor 22L. In addition, a first series circuit 14 constituted by the inductor 22L and the switch 22SW is connected in parallel to the capacitor 22C.

The filter circuit 122D having the above-described configuration has a ladder filter structure with one stage constituted by one series-arm circuit (here, the series-arm resonator 22s) and the one parallel-arm circuit 12.

Regarding the composite impedance of the parallel-arm circuit 12, the frequency at which the impedance is minimum is shifted to the low band side or high band side in accordance with switching between ON and OFF of the switch 22SW. This will be described below together with the bandpass characteristic of the filter circuit 122D.

In the present embodiment, the individual resonators constituting the filter circuit 122D (series-arm resonator 22s and parallel-arm resonator 22p) are resonators using a surface acoustic wave. Accordingly, the filter circuit 122D can be constituted by interdigital transducer (IDT) electrodes formed on a piezoelectric substrate, and thus it is possible to obtain a compact and low-profile filter circuit having a bandpass characteristic with a high degree of steepness.

Regarding the bandpass characteristic of the filter circuit 122D having the above-described configuration, switching between the first bandpass characteristic and the second bandpass characteristic is performed as a result of switching between ON and OFF of the switch 22SW performed in accordance with the control signal ϕctrl. Hereinafter, a description will be given of the bandpass characteristic of the filter circuit 122D together with the state of the switch 22SW.

First, a description will be given of the impedance characteristic of a resonator alone. Hereinafter, regarding not only the impedance of a resonator alone but also the composite impedance of the elements constituting the filter circuit 122D, a singular point at which the impedance is minimum (ideally a point at which the impedance is 0) is referred to as a "resonant point", and the frequency at the resonant point is referred to as a "resonant frequency" for convenience. Also, a singular point at which the impedance is maximum (ideally a point at which the impedance is infinite) is referred to as an "anti-resonant point", and the frequency at the anti-resonant point is referred to as an "anti-resonant frequency".

As illustrated in FIG. 15A, the series-arm resonator 22s and the parallel-arm resonator 22p have the following impedance characteristics. Specifically, the parallel-arm resonator 22p has the resonant frequency frp and the anti-resonant frequency fap (at this time, frp<fap is satisfied). The series-arm resonator 22s has the resonant frequency frs and the anti-resonant frequency fas (at this time, frs<fas and frp<frs are satisfied).

When the switch 22SW is OFF, the impedance characteristic of the filter circuit 122D is a composite impedance characteristic including the impedance characteristic of the series-arm resonator 22s and the impedance characteristic of the parallel-arm circuit 12 including the parallel-arm resonator 22p and the capacitor 22C connected in series to each other.

Thus, in the present embodiment, when the switch 22SW is OFF (when the first switch element is in an OFF-state), the frequency (the resonant frequency frpoff of the parallel-arm circuit 12) at which the composite impedance of the parallel-arm resonator 22p and the capacitor 22C (first impedance element) is minimum is higher than the frequency (the resonant frequency frp of the parallel-arm resonator 22p) at which the impedance of the parallel-arm resonator 22p is minimum.

Specifically, when the switch 22SW is OFF, the impedance characteristic of the parallel-arm circuit 12 is a composite impedance characteristic of the parallel-arm resonator 22p and the capacitor 22C. Thus, the resonant frequency frpoff of the parallel-arm circuit 12 at this time is higher than the resonant frequency frp of the parallel-arm resonator 22p. In addition, the anti-resonant frequency faoff of the parallel-arm circuit 12 at this time is almost identical to the anti-resonant frequency fap of the parallel-arm resonator 22p.

In the case of configuring a bandpass filter using ladder resonators, the anti-resonant frequency faoff of the parallel-arm circuit 12 and the resonant frequency frs of the series-arm resonator 22s are set to be close to each other. Accordingly, when the switch 22SW is OFF, the frequencies near the resonant frequency frpoff at which the impedance of the parallel-arm circuit 12 is closer to 0 correspond to a low-frequency-side stop band. At a higher frequency, the impedance of the parallel-arm circuit 12 is higher at the frequencies near the anti-resonant frequency faoff, and the impedance of the series-arm resonator 22s is closer to 0 at the frequencies near the resonant frequency frs. Accordingly, the frequencies near the anti-resonant frequency faoff and the resonant frequency frs serve as a signal pass band in the signal path (series arm) from the input/output terminal 22m to the input/output terminal 22n. At a still higher frequency near the anti-resonant frequency fas, the impedance of the series-arm resonator 22s is higher, which corresponds to a high-frequency-side stop band.

That is, when the switch 22SW is OFF, the filter circuit 122D has the first bandpass characteristic in which the pass band is determined by the anti-resonant frequency faoff and the resonant frequency frs, the pole (attenuation pole) on the low band side of the pass band is determined by the resonant frequency frpoff, and the pole (attenuation pole) on the high band side of the pass band is determined by the anti-resonant frequency fas. Thus, in the first bandpass characteristic, compared with the bandpass characteristic of a basic filter structure constituted by only the series-arm resonator 22s and the parallel-arm resonator 22p, the pole on the low band side of the pass band is shifted to the high band side. Thus, when the switch 22SW is OFF, the filter circuit 122D is able to reduce the pass band width by shifting the lower end of the pass band to the high band side, compared with the basic filter structure.

On the other hand, when the switch 22SW is ON, the impedance characteristic of the filter circuit 122D is a composite impedance characteristic including the impedance characteristic of the series-arm resonator 22s and the impedance characteristic of the parallel-arm circuit 12 in which an LC parallel resonant circuit constituted by the capacitor 22C and the inductor 22L is connected in series to the parallel-arm resonator 22p.

Thus, in the present embodiment, when the switch 22SW is ON (when the first switch element is in an ON-state), the frequency (the resonant frequency frpon of the parallel-arm circuit 12) at which the composite impedance of the parallel-arm resonator 22p and the capacitor 22C and the inductor 22L (first and second impedance elements) is minimum is lower than the frequency (the resonant frequency frp of the parallel-arm resonator 22p) at which the impedance of the parallel-arm resonator 22p is minimum.

Specifically, when the switch 22SW is ON, the impedance characteristic of the parallel-arm circuit 12 is a composite impedance characteristic of the parallel-arm resonator 22p and the LC parallel resonant circuit. Thus, the resonant frequency (frpon) of the parallel-arm circuit 12 at this time is a frequency that is based on the resonant frequency frp of the parallel-arm resonator 22p and the resonant frequency $f_{LC}$ of the LC parallel resonant circuit. Specifically, when $f_{LC}$ is higher than frp, frpon is lower than frp. When $f_{LC}$ is lower than frp, frpon is higher than frp. In the present embodiment, the LC parallel resonant circuit is configured so that the resonant frequency $f_{LC}$ is higher than frp, and thus frpon is lower than frp. Here, the resonant frequency $f_{LC}$ of the LC parallel resonant circuit is expressed as $f_{LC}=1/(2\pi\sqrt{(LC)})$, where C represents the capacitance of the capacitor 22C and L represents the inductance of the inductor 22L. In addition, the anti-resonant frequency faon of the parallel-arm circuit 12 at this time is almost identical to the anti-resonant frequency fap of the parallel-arm resonator 22p.

In the case of configuring a bandpass filter using ladder resonators, the anti-resonant frequency fapon of the parallel-arm circuit 12 and the resonant frequency frs of the series-arm resonator 22s are set to be close to each other. Accordingly, when the switch 22SW is ON, the frequencies near the resonant frequency frpon at which the impedance of the parallel-arm circuit 12 is closer to 0 correspond to a low-frequency-side stop band. At a higher frequency, the impedance of the parallel-arm circuit 12 is higher at the frequencies near the anti-resonant frequency fapon, and the impedance of the series-arm resonator 22s is closer to 0 at the frequencies near the resonant frequency frs. Accordingly, the frequencies near the anti-resonant frequency fapon and the resonant frequency frs serve as a signal pass band in the signal path (series arm) from the input/output terminal 22m to the input/output terminal 22n. At a still higher frequency near the anti-resonant frequency fas, the impedance of the series-arm resonator 22s is higher, which corresponds to a high-frequency-side stop band.

That is, when the switch 22SW is ON, the filter circuit 122D has the second bandpass characteristic in which the pass band is determined by the anti-resonant frequency fapon and the resonant frequency frs, the pole (attenuation pole) on the low band side of the pass band is determined by the resonant frequency frpon, and the pole (attenuation pole) on the high band side of the pass band is determined by the anti-resonant frequency fas. As described above, when $f_{LC}$>frp, the resonant frequency frpon is lower than the resonant frequency frp of the parallel-arm resonator 22p. Thus, in the second bandpass characteristic, compared with the bandpass characteristic of a basic filter structure constituted by only the series-arm resonator 22s and the parallel-arm resonator 22p, the pole on the low band side of the pass band may be shifted to the low band side. Thus, when the switch 22SW is ON, the filter circuit 122D is able to increase the pass band width by shifting the lower end of the pass band to the low band side, compared with the basic filter structure.

That is, in the filter circuit 122D, switching between connection and disconnection of the second impedance element is performed in the impedance circuit 13 in accordance with switching between ON and OFF of the switch 22SW, and thus the impedance of the impedance circuit 13 is switched. In addition, since the first impedance element is one of the inductor 22L and the capacitor 22C and the second impedance element is the other of the inductor 22L and the capacitor 22C, the impedance circuit 13 when the switch 22SW is ON has a frequency at which the impedance is maximum, due to the parallel circuit including the inductor 22L and the capacitor 22C. Thus, the parallel-arm circuit 12 when the switch 22SW is ON has two resonant frequencies including a resonant frequency lower than the resonant frequency of the parallel-arm resonator 22p.

Thus, when the switch 22SW is ON, the parallel-arm circuit 12 has a resonant frequency lower than the resonant frequency of the parallel-arm resonator 22p, and thus sufficient attenuation can be acquired in the attenuation band lower than the resonant frequency of the parallel-arm resonator 22p.

Specifically, the first impedance element is the capacitor 22C, and the second impedance element is the inductor 22L.

Accordingly, when the switch 22SW is ON, the impedance circuit 13 is a circuit in which the inductor 22L and the capacitor 22C are connected in parallel to each other, and has an impedance characteristic having a frequency at which the impedance is maximum. Thus, when the switch 22SW is ON, the parallel-arm circuit 12 has two resonant frequencies including a resonant frequency lower than the resonant frequency of the parallel-arm resonator 22p.

On the other hand, when the switch 22SW is OFF, the impedance circuit 13 is a circuit including only the capacitor 22C and thus has a capacitive impedance. Thus, when the switch 22SW is OFF, the parallel-arm circuit 12 has only one resonant frequency that is higher than the resonant frequency of the parallel-arm resonator 22p and that is lower than the anti-resonant frequency of the parallel-arm resonator 22p.

Thus, in accordance with switching between ON and OFF of the switch 22SW, the resonant frequency of the parallel-arm circuit 12 and the number of resonant frequencies can be switched, and thus the frequency of the attenuation pole and the number of attenuation poles can be switched. Furthermore, when the switch 22SW is ON, sufficient attenuation can be acquired in the attenuation band lower than the resonant frequency of the parallel-arm resonator 22p.

[3.2 Modification Example of Filter (Tunable Filter)]

A description has been given so far of an example of the configuration including a capacitor serving as the first impedance element and an inductor serving as the second impedance element. Alternatively, this relationship may be inverted. Hereinafter, a description will be given of such a filter as a filter according to a modification example of the present embodiment.

Figure 15B:
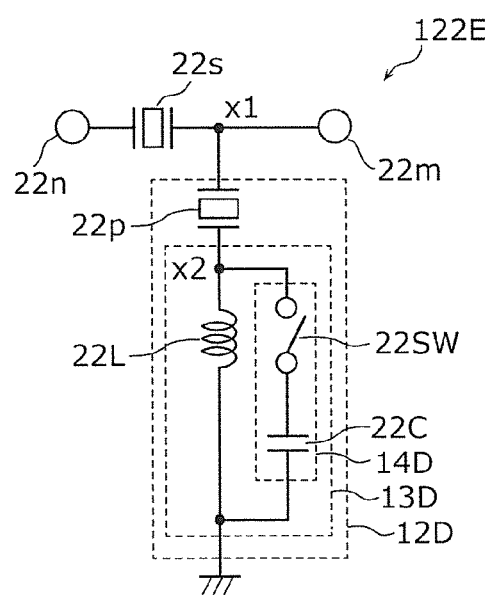
FIG. 15B is a circuit configuration diagram of a filter circuit according to a modification example of the third embodiment.

FIG. 15B is a circuit configuration diagram of a filter circuit 122E according to a modification example of the third embodiment. The filter circuit 122E illustrated in FIG. 15B is different from the filter circuit 122D illustrated in FIG. 15A in that the capacitor and the inductor are interchanged. Hereinafter, a description will be given mainly of the difference from the filter circuit 122D according to the third embodiment, and a description of the same point will be omitted.

In the present modification example, the inductor 22L is the first impedance element connected in series to the parallel-arm resonator 22p between the parallel-arm resonator 22p and the ground. That is, the inductor 22L has one terminal connected to the ground-side terminal of the parallel-arm resonator 22p and the other terminal connected to the ground.

In the present modification example, the capacitor 22C is the second impedance element having one terminal connected to the other terminal of the switch 22SW and the other terminal connected to the ground.

That is, in the present modification example, the switch 22SW and the capacitor 22C are connected in parallel to the inductor 22L while being connected in series to each other. Thus, the parallel-arm resonator 22p is connected in series to the inductor 22L when the switch 22SW is OFF, and is connected in series to the LC parallel resonant circuit constituted by the inductor 22L and the capacitor 22C when the switch 22SW is ON, as in the third embodiment.

Regarding the bandpass characteristic of the filter circuit 122E having the above-described configuration, switching between the first bandpass characteristic and the second bandpass characteristic is performed in accordance with switching between ON and OFF of the switch 22SW performed in accordance with a control signal.

Here, the impedance characteristic of a resonator alone is similar to the characteristics described above regarding the filter circuit 122D. Thus, hereinafter, the description thereof will be omitted.

When the switch 22SW is OFF, the impedance characteristic of the filter circuit 122E is a composite impedance characteristic including the impedance characteristic of the series-arm resonator 22s and the impedance characteristic of a parallel-arm circuit 12D including the parallel-arm resonator 22p and the inductor 22L connected in series to each other.

Thus, in the present modification example, when the switch 22SW is OFF (when the first switch element is in an OFF-state), the frequency (the resonant frequency frpoff of the parallel-arm circuit) at which the composite impedance of the parallel-arm resonator 22p and the inductor 22L (first impedance element) is minimum is lower than the frequency (the resonant frequency frp of the parallel-arm resonator 22p) at which the impedance of the parallel-arm resonator 22p is minimum.

Specifically, when the switch 22SW is OFF, the impedance characteristic of the parallel-arm circuit 12D constituted by the parallel-arm resonator 22p and the inductor 22L is a composite impedance characteristic of the parallel-arm resonator 22p and the inductor 22L. Thus, the resonant frequency frpoff of the parallel-arm circuit at this time is lower than the resonant frequency frp of the parallel-arm resonator 22p. In addition, the anti-resonant frequency faoff of the parallel-arm circuit at this time is almost identical to the anti-resonant frequency fap of the parallel-arm resonator 22p.

That is, when the switch 22SW is OFF, the filter circuit 122E has the first bandpass characteristic in which the pass band is determined by the anti-resonant frequency fapoff and the resonant frequency frs, the pole (attenuation pole) on the low band side of the pass band is determined by the resonant frequency frpoff, and the pole (attenuation pole) on the high band side of the pass band is determined by the anti-resonant frequency fas. Thus, in the first bandpass characteristic, compared with the bandpass characteristic of a basic filter structure constituted by only the series-arm resonator 22s and the parallel-arm resonator 22p, the pole on the low band side of the pass band is shifted to the low band side. Thus, when the switch 22SW is OFF, the filter circuit 122E is able to increase the pass band width by shifting the lower end of the pass band to the low band side, compared with the basic filter structure.

On the other hand, when the switch 22SW is ON, the impedance characteristic of the filter circuit 122E is a composite impedance characteristic including the impedance characteristic of the series-arm resonator 22s and the impedance characteristic of the parallel-arm circuit 12D in which an LC parallel resonant circuit constituted by the capacitor 22C and the inductor 22L is connected in series to the parallel-arm resonator 22p.

Thus, in the present modification example, when the switch 22SW is ON (when the first switch element is in an ON-state), the frequency (the resonant frequency frpon of the parallel-arm circuit) at which the composite impedance of the parallel-arm resonator 22p and the inductor 22L and the capacitor 22C (first and second impedance elements) is minimum is higher than the frequency (the resonant frequency frp of the parallel-arm resonator 22p) at which the impedance of the parallel-arm resonator 22p is minimum.

Specifically, when the switch 22SW is ON, the impedance characteristic of the parallel-arm circuit 12D constituted by the parallel-arm resonator 22p and the LC parallel resonant circuit is a composite impedance characteristic of the parallel-arm resonator 22p and the LC parallel resonant circuit. Thus, the resonant frequency (frpon) of the parallel-arm circuit 12D at this time is a frequency that is based on the resonant frequency frp of the parallel-arm resonator 22p and the resonant frequency $f_{LC}$ of the LC parallel resonant circuit. Specifically, when $f_{LC}$ is higher than frp, frpon is lower than frp. When $f_{LC}$ is lower than frp, frpon is higher than frp. In the present modification example, the LC parallel resonant circuit is configured so that the resonant frequency $f_{LC}$ is lower than frp, and thus frpon is higher than frp. Here, the resonant frequency $f_{LC}$ of the LC parallel resonant circuit is expressed as $f_{LC}=1/(2\pi\sqrt{(LC)})$, as in the third embodiment. In addition, the anti-resonant frequency faon of the parallel-arm circuit 12D at this time is almost identical to the anti-resonant frequency fap of the parallel-arm resonator 22p.

That is, when the switch 22SW is ON, the filter circuit 122E has the second bandpass characteristic in which the pass band is determined by the anti-resonant frequency fapon and the resonant frequency frs, the pole (attenuation pole) on the low band side of the pass band is determined by the resonant frequency frpon, and the pole (attenuation pole) on the high band side of the pass band is determined by the anti-resonant frequency fas. As described above, when $f_{LC}$<frp, the resonant frequency frpon is higher than the resonant frequency frp of the parallel-arm resonator 22p. Thus, in the second bandpass characteristic, compared with the bandpass characteristic of a basic filter structure constituted by only the series-arm resonator 22s and the parallel-arm resonator 22p, the pole on the low band side of the pass band may be shifted to the high band side. Thus, when the switch 22SW is ON, the filter circuit 122E is able to decrease the pass band width by shifting the lower end of the pass band to the high band side, compared with the basic filter structure.

That is, in the filter circuit 122E according to the present modification example, as in the filter circuit 122D described above, the resonant frequency is lower than the resonant frequency of the parallel-arm resonator 22p, and thus sufficient attenuation can be acquired in the attenuation band lower than the resonant frequency of the parallel-arm resonator 22p.

Specifically, the first impedance element is the inductor 22L, and the second impedance element is the capacitor 22C.

Accordingly, when the switch 22SW is ON, an impedance circuit 13D is a circuit in which the inductor 22L and the capacitor 22C are connected in parallel to each other, and has an impedance characteristic having a frequency at which the impedance is maximum. Thus, when the switch 22SW is ON, the parallel-arm circuit 12D has two resonant frequencies including a resonant frequency lower than the resonant frequency of the parallel-arm resonator 22p.

On the other hand, when the switch 22SW is OFF, the impedance circuit 13D is a circuit including only the inductor 22L and thus has inductive impedance. Thus, when the switch 22SW is OFF, the parallel-arm circuit 12D has two resonant frequencies, that is, a resonant frequency lower than the resonant frequency of the parallel-arm resonator 22p and a resonant frequency higher than the resonant frequency of the parallel-arm resonator 22p.

Thus, in accordance with switching between ON and OFF of the switch 22SW, the frequency of the attenuation pole can be switched. Furthermore, when the switch 22SW is ON, sufficient attenuation can be acquired in the attenuation band lower than the resonant frequency of the parallel-arm resonator 22p.

[3.3 Advantages and the Like]

A description has been given of the filter circuits 122D and 122E (RF filter circuits) according to the third embodiment and its modification example. Hereinafter, a description will be given of advantages produced by the filter circuits 122D and 122E.

The filter circuits 122D and 122E (RF filter circuits) according to the present embodiment and its modification example include the first impedance element (the capacitor 22C in the third embodiment, the inductor 22L in the modification example) connected in series to the parallel-arm resonator 22p; the switch 22SW (first switch element) having one terminal connected to the connection node (node x2 in FIG. 15A) between the parallel-arm resonator 22p and the first impedance element; and the second impedance element (the inductor 22L in the third embodiment, the capacitor 22C in the modification example) connected to the other terminal of the switch 22SW.

Accordingly, in accordance with switching between ON and OFF of the switch 22SW, the second impedance element is connected to or disconnected from the parallel-arm resonator 22p, and thus the impedance applied to the parallel-arm resonator 22p is changed. As a result, the frequency (the resonant frequency of the parallel-arm circuit in the above description) at which the impedance of the parallel arm between the ground and the node on the path that connects the input/output terminal 22m (first input/output terminal) and the input/output terminal 22n (second input/output terminal) is minimum is changed. Therefore, the pole (attenuation pole) on the low band side of the pass band determined by the frequency at which the impedance of the parallel arm is minimum is changed in accordance with switching between ON and OFF of the switch 22SW, and the lower end of the pass band can be changed.

Here, since the first impedance element is one of an inductor and a capacitor and the second impedance element is the other, the following two states can be realized only by performing switching between ON and OFF of the one switch 22SW. Specifically, it is possible to realize a first state where the frequency at which the impedance of the parallel arm is minimum, which is a frequency determining the attenuation pole on the low band side of the pass band, is lower than the resonant frequency of the parallel-arm resonator 22p, and a second state where the frequency is higher than the resonant frequency of the parallel-arm resonator 22p. Thus, it is possible to increase the frequency variable width at the lower end of the pass band in accordance with switching between ON and OFF of the switch 22SW. That is, in the filter circuits 122D and 122E according to the present embodiment and its modification example, it is possible to perform the size reduction and to increase the frequency variable width of the pass band and the attenuation pole on the low-band side of the pass band.

In the filter circuit 122D according to the present embodiment, the first impedance element is the capacitor 22C, and the second impedance element is the inductor 22L.

Accordingly, the lower end of the pass band and the attenuation pole on the low band side of the pass band can be shifted to the low band side by turning ON the switch 22SW, and the lower end of the pass band and the attenuation pole on the low band side of the pass band can be shifted to the high band side by turning OFF the switch 22SW. Typically, a capacitor has a larger Q value than an inductor. Thus, with use of the capacitor 22C as the first impedance element, the Q value of the parallel arm when the switch 22SW is ON can be increased. Accordingly, it is possible to increase the degree of the steepness of the attenuation slope on the low band side of the pass band when the switch 22SW is OFF.

In addition, in the filter circuit 122D according to the present embodiment, when the switch 22SW is ON, the frequency (in the above description, the resonant frequency frpon of the parallel-arm circuit) at which the composite impedance of the parallel-arm resonator 22p and the first and second impedance elements is minimum is lower than the frequency (i.e., the resonant frequency frp of the parallel-arm resonator 22p) at which the impedance of the parallel-arm resonator 22p is minimum. On the other hand, when the switch 22SW is OFF (when the first switch element is in an OFF-state), the frequency (in the above description, the resonant frequency frpoff of the parallel-arm circuit) at which the composite impedance of the parallel-arm resonator 22p and the first impedance element is minimum is higher than the frequency (i.e., the resonant frequency frp of the parallel-arm resonator 22p) at which the impedance of the parallel-arm resonator 22p is minimum.

Accordingly, in the first pass band and the second pass band, switching therebetween being performed in accordance with switching between ON and OFF of the switch 22SW, it is possible to increase the frequency variable width at the lower end of the pass band and at the attenuation pole on the low band side of the pass band.

In the filter circuit 122E according to the modification example of the present embodiment, the first impedance element is the inductor 22L, and the second impedance element is the capacitor 22C.

Accordingly, the lower end of the pass band and the attenuation pole on the low band side of the pass band can be shifted to the high band side by turning ON the switch 22SW, and the lower end of the pass band and the attenuation pole on the low band side of the pass band can be shifted to the low band side by turning OFF the switch 22SW. In addition, compared with a case where the first impedance element is a capacitor and the second impedance element is an inductor, it is possible to reduce the loss in the pass band when the switch 22SW is OFF.

In addition, in the filter circuit 122E according to the modification example of the present embodiment, when the switch 22SW is ON (when the first switch element is in an ON-state), the frequency (the resonant frequency frpon of the parallel-arm circuit) at which the composite impedance of the parallel-arm resonator 22p and the inductor 22L and the capacitor 22C (first and second impedance elements) is minimum is higher than the frequency (the resonant frequency frp of the parallel-arm resonator 22p) at which the impedance of the parallel-arm resonator 22p is minimum. On the other hand, when the switch 22SW is OFF (when the first switch element is in an OFF-state), the frequency (the resonant frequency frpoff of the parallel-arm circuit) at which the composite impedance of the parallel-arm resonator 22p and the inductor 22L (first impedance element) is minimum is lower than the frequency (the resonant frequency frp of the parallel-arm resonator 22p) at which the impedance of the parallel-arm resonator 22p is minimum.

Accordingly, in the first pass band and the second pass band, switching therebetween being performed in accordance with switching between ON and OFF of the switch 22SW, it is possible to increase the frequency variable width at the lower end of the pass band and at the attenuation pole on the low band side of the pass band.

In the third embodiment and its modification example, a description has been given of a parallel-arm circuit that includes one first series circuit (the first series circuit 14 in the third embodiment, a first series circuit 14D in the modification example) constituted by the first switch element and the second impedance element. However, the parallel-arm circuit may include a plurality of first series circuits. With this configuration, ON or OFF of the first switch element is appropriately selected in each of the plurality of first series circuits, and thus the attenuation pole on the low band side of the pass band can be finely adjusted. At this time, the timing of switching between ON and OFF of the first switch element included in one first series circuit and the timing of switching between ON and OFF of the first switch element included in another first series circuit may be the same or different.

In addition, a second series circuit constituted by a first switch element and a third impedance element may be added to the filter circuit that includes a plurality of first series circuits each of which is constituted by a first switch element and a second impedance element. With this configuration, ON or OFF of the first switch element of the second series circuit is appropriately selected, and thus the attenuation pole on the low band side of the pass band can be finely adjusted. In this configuration, inductors may be used as the first and third impedance elements, and a capacitor may be used as the second impedance element. In addition, at this time, the timing of switching between ON and OFF of the first switch element included in the second series circuit and the timing of switching between ON and OFF of another first switch element may be the same or different.

Regarding the connection order of the impedance circuit and the parallel-arm resonator 22p, the impedance circuit is connected between the parallel-arm resonator 22p and the ground in the third embodiment and its modification example. That is, the parallel-arm resonator 22p is connected near the node x1, and the impedance circuit is connected near the ground. However, the connection order is not particularly limited thereto and may be reversed. Note that, if the connection order is reversed, the loss in the pass band of the filter circuit increases. In addition, when the parallel-arm resonator 22p is formed on a chip (package) for resonators together with other elastic wave resonators, an increase in the number of the terminals of the chip leads to an increase in the chip size. Thus, from the viewpoint of the filter characteristics and a reduction in size, it is preferable that the connection order according to the third embodiment and its modification example be adopted.

A similar technique is applicable to a ladder filter structure including a plurality of stages. A filter having a ladder filter structure including a plurality of stages is applicable to, for example, a diversity tunable filter compatible with the reception bands of Band 11, Band 21, and Band 32 of the LTE standard.

Fourth Embodiment

The filter modules having the configurations described in the first to third embodiments and their modification examples are also applicable to an RF front-end circuit compatible with a system that uses a larger number of bands than the RF front-end circuit 2 according to the first embodiment. In the present embodiment, a description will be given of such an RF front-end circuit.

Figure 16:
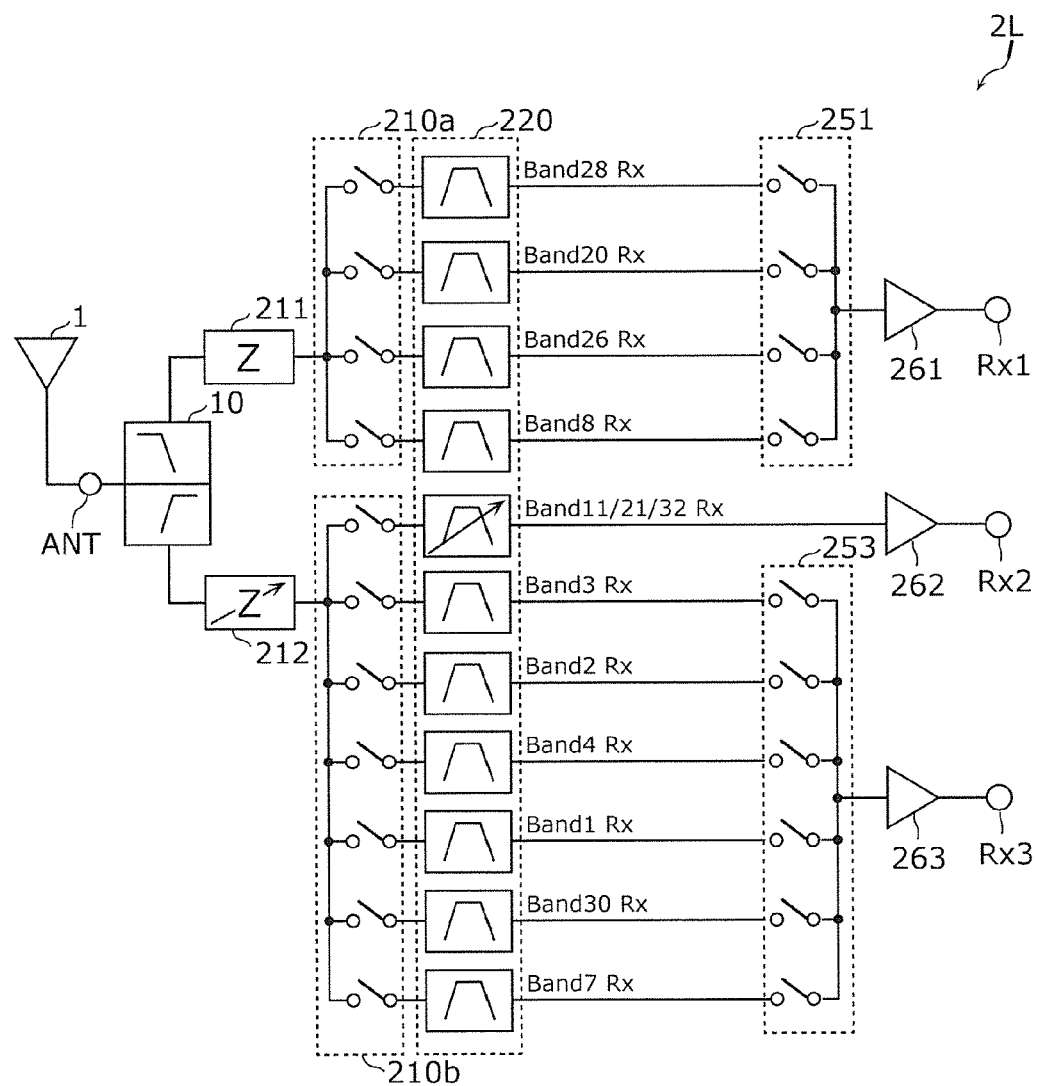
FIG. 16 is a configuration diagram of a radio-frequency front-end circuit according to a fourth embodiment.

FIG. 16 is a configuration diagram of an RF front-end circuit 2L according to a fourth embodiment.

As illustrated in FIG. 16, the RF front-end circuit 2L includes the antenna terminal ANT connected to the antenna element 1 and reception terminals Rx1 to Rx3, and also includes, in order from the antenna terminal ANT, a diplexer 10, impedance matching circuits 211 and 212, switch groups 210a and 210b each being constituted by a plurality of switches, a filter group 220 constituted by a plurality of filters, reception-side switches 251 and 253, and reception amplifier circuits 261 to 263.

The diplexer 10 is a separator that separates a low-band-side RF signal (here, RF reception signal) and a high-band-side RF signal (here, RF reception signal) from each other.

The impedance matching circuit 211 is an impedance matching circuit in which the element value for achieving impedance matching is fixed. The impedance matching circuit 212 is any one of the above-described impedance matching circuits, which includes a switch (second switch element) and in which the element value for achieving impedance matching is switched in accordance with switching between ON and OFF of the switch.

Each of the switch groups 210a and 210b connects the antenna terminal ANT and a signal path corresponding to the predetermined band in accordance with a control signal from a controller (not illustrated) and is constituted by, for example, a plurality of SPST-type switches. The number of signal paths connected to the antenna terminal ANT is not limited to one, and a plurality of signal paths may be connected. That is, the RF front-end circuit 2L may support carrier aggregation. In addition, each of the switch groups 210a and 210b may be constituted by SPnT-type switches.

The filter group 220 is constituted by a plurality of filters having the following bands as pass bands. Specifically, the bands include (i) the reception band of Band 28, (ii) the reception band of Band 20, (iii) the reception band of Band 26, (iv) the reception band of Band 6, (v) the reception band of Band 11 (or Band 21 or Band 32), (vi) the reception band of Band 3, (vii) the reception band of Band 2, (viii) the reception band of Band 4, (ix) the reception band of Band 1, (x) the reception band of Band 30, and (xi) the reception band of Band 7.

The reception-side switch 251 is a switch circuit including a plurality of selection terminals connected to a plurality of reception-side signal paths on the low band side and a common terminal connected to the reception amplifier circuit 261. The reception-side switch 253 is a switch circuit including a plurality of selection terminals connected to a plurality of reception-side signal paths on the high band side and a common terminal connected to the reception amplifier circuit 263. The reception-side switches 251 and 253 are provided in the subsequent stage of the filter group 220 (here, the subsequent stage in the reception-side signal paths), and the connection states thereof are switched in accordance with a control signal from the controller (not illustrated). Accordingly, RF signals (here, RF reception signals) inputted to the antenna terminal ANT pass through the predetermined filters in the filter group 220, are amplified by the reception amplifier circuits 261 to 263, and are outputted from the reception terminals Rx1 to Rx3 to the RFIC 3 (see FIG. 1). Alternatively, an RFIC for the low band and an RFIC for a high band may be separately provided.

The reception amplifier circuit 261 is a low-noise amplifier that amplifies the power of a low-band RF reception signal. The reception amplifier circuit 262 is a low-noise amplifier that amplifies the power of an RF reception signal of Band 11 (or Band 21 or Band 32). The reception amplifier circuit 263 is a low-noise amplifier that amplifies the power of a high-band RF reception signal.

The RF front-end circuit 2L having the above-described configuration includes, as a filter whose pass band includes (v) the reception band of Band 11 (or Band 21 or Band 32), a filter that includes a switch (first switch element) and that switches the pass band to any of Band 11 Rx, Band 21 Rx, and Band 32 Rx in accordance with switching between ON and OFF of the switch.

Here, the switch (first switch element) of the foregoing filter and the switch (second switch element) of the impedance matching circuit 212 synchronize with each other regarding the timing of switching between ON and OFF.

In the RF front-end circuit 2L having the above-described configuration, the frequencies of the pass band or the frequency of at least one attenuation pole can be switched while suppressing an increase in insertion loss within the pass band.

In addition, the RF front-end circuit 2L according to the present embodiment includes the reception-side switches 251 and 253 (switch circuits) provided in the preceding stage or the subsequent stage of the filter group 220 (a plurality of RF filter circuits). With this configuration, some of the signal paths through which RF signals are transmitted can be integrated. Accordingly, for example, the reception amplifier circuits 261 and 262 (amplifier circuits) for a plurality of RF filter circuits can be integrated. As a result, the size and cost of the RF front-end circuit 2L can be reduced.

It is sufficient that at least one of the reception-side switches 251 and 253 be provided. The number of selection terminals or the like of the reception-side switches 251 and 253 is not limited to that in the present embodiment, and may be two or more.

Other Embodiments

A description has been given above of the RF filter device according to the present disclosure, using the embodiments and modification examples. The RF filter device according to the present disclosure is not limited to the above-described embodiments and modification examples. Another embodiment that is implemented by combining any elements in the above-described embodiments and modification examples, a modification example that is obtained by applying various changes conceived of by a person skilled in the art to the above-described embodiments without deviating from the gist of the present disclosure, and various apparatuses including the RF filter device according to the present disclosure are also included in the present disclosure.

The present disclosure is not limited to the above-described RF filter device, and also includes a communication apparatus including the RF filter device.

The controller 27 according to the present disclosure may be implemented as large scale integration (LSI), which is an integrated circuit (IC). The method for circuit integration may be realized by using a dedicated circuit or general-purpose processor. A field programmable gate array (FPGA) that can be programmed after LSI manufacturing, or a reconfigurable processor in which the connections and settings of a circuit cell in LSI are reconfigurable may be used. Furthermore, if the progress of semiconductor technologies or other derived technologies produce a circuit integration technology that replaces LSI, the integration of functional blocks may of course be performed by using the technology.

In the impedance matching circuits and the filter circuits according to the foregoing embodiments and modification examples, an inductor or capacitor may be connected or a circuit element other than an inductor and capacitor, such as a resistance element, may be added between individual terminals, such as an input/output terminal and a ground terminal. Alternatively, an RF filter device or communication apparatus may include, between individual components, an inductor or capacitor, a wiring inductor formed of wiring for connecting individual components, or a capacitor between wiring patterns.

In the above-described second embodiment, for example, it is sufficient that the parallel-arm circuit include a plurality of parallel-arm resonators including a first parallel-arm resonator and a second parallel-arm resonator. The number of parallel-arm resonators may be three or more.

In the above-described second and third embodiments, for example, the parallel-arm circuit need not necessarily be connected to the node on the input/output terminal 22m side of the series-arm resonator 22s and may be connected to the node on the input/output terminal 22n side of the series-arm resonator 22s.

In the above-described second embodiment, the frequency interval between the resonant point and the anti-resonant point of a series-arm resonator alone (the resonator bandwidth of the series-arm resonator) and the frequency interval between the resonant point and the anti-resonant point of first and second parallel-arm resonators alone (the resonator bandwidth of the parallel-arm resonator) are not particularly limited in terms of which is larger. However, from the viewpoint of increasing the frequency variable width, it is preferable that the resonator bandwidth of the parallel-arm resonator and the resonator bandwidth of the series-arm resonator be almost equal or that the parallel-arm resonator have a wider resonator bandwidth than the series-arm resonator. Here, "almost equal" means not only "completely equal" but also "substantially equal". This may be applied to one of the first and second parallel-arm resonators (for example, the parallel-arm resonator connected in series to the impedance element), or to both the first and second parallel-arm resonators.

The controller 27 may be built in the RFIC 3 (RF signal processing circuit) or may be built in the filter module.

For example, the above-described filter module may be applied to a filter module including only one RF filter circuit instead of being applied to a multiplexer including a plurality of RF filter circuits.

For example, the multiplexer may be a duplexer in which the above-described RF filter circuit is applied to both the transmission filter and the reception filter.

The multiplexer is not limited to a duplexer, and may be, for example, a triplexer or the like including three RF filter circuits. The configuration of the multiplexer is not limited to a configuration including a transmission-side filter and a reception-side filter, and may be a configuration including a plurality of reception-side filters.

The RF filter device and the communication apparatus according to present disclosure are applicable to a front-end portion of a multi-band and multi-mode system and are widely usable for communication equipment such as a cellular phone.

1 antenna element
2, 2L radio-frequency front-end circuit
3 RFIC (RF signal processing circuit)
4 communication apparatus
10 diplexer
10a, 10d, 10e first circuit
12, 12D, 120A, 120D, 120E parallel-arm circuit
13, 13D impedance circuit
14, 14D first series circuit
20, 20A, 90 filter module (radio-frequency filter device)
20a, 20d, 20e second circuit
21, 21A to 21C impedance matching circuit
22, 23, 22A, 22B, 22D, 22E, 122A to 122E filter circuit (radio-frequency filter circuit)
22C, 22C1, 22C2, 211C, 212C, 221C to 224C capacitor (impedance element)
22L, 211L to 213L, 221L to 224L, 225L inductor (impedance element)
22m input/output terminal (first input/output terminal)
22n input/output terminal (second input/output terminal)
22p, 22p1, 22p2, 221p to 224p, 221pa to 224pa, 231p, parallel-arm resonator
22SW, 22SW1, 22SW2, 212SW, 221SW to 224SW switch (switch element)
22s, 221s to 224s, 231s to 233s series-arm resonator
22T, 22Ta, 22Tb frequency variable circuit
24 transmission amplifier circuit
26, 261 to 263 reception amplifier circuit
31 module substrate
32 switch IC
33A, 33B resonance package
34A, 34B chip component
120, Tx transmission terminal
130, Rx, Rx1 to Rx3 reception terminal
202, 204 input/output terminal
210a, 210b switch group
220 filter group
251, 253 reception-side switch (switch circuit)
250 longitudinally coupled resonator
271, 272 control line
ANT antenna terminal
N common connection point

The invention claimed is:

1. A radio-frequency filter device comprising:
   a radio-frequency filter circuit comprising a first switch configured to selectively switch frequencies of a pass band or a frequency of at least one attenuation pole of the radio-frequency filter circuit in accordance with a state of the first switch; and
   an impedance matching circuit comprising a second switch configured to selectively adjust an impedance value for achieving impedance matching with the impedance matching circuit in accordance with a state of the second switch, wherein
   the states of the first switch and the second switch are selectively switched in synchronization with each other.

2. The radio-frequency filter device according to claim 1, further comprising:
   a control line configured to transmit a control signal to the radio-frequency filter circuit and to the impedance matching circuit, wherein the control signal causes the first switch and the second switch to selectively switch states.

3. The radio-frequency filter device according to claim 1, wherein the first switch and the second switch have a same state.

4. The radio-frequency filter device according to claim 1, wherein the first switch and the second switch have different states.

5. The radio-frequency filter device according to claim 1, wherein:
   the radio-frequency filter circuit further comprises a third switch configured to selectively switch the frequencies of the pass band or the frequency of the at least one attenuation pole being of the radio-frequency filter circuit in accordance with a state of the third switch,
   the impedance matching circuit further comprises a fourth switch configured to selectively adjust the impedance value for achieving impedance matching being switched with the impedance matching circuit in accordance with a state of the fourth switch,
   wherein the states of the third switch and the fourth switch are selectively switched in synchronization with each other, and
   wherein the states of the first and second switches, and the states of the third and fourth switches are selectively switched independent of each other.

6. The radio-frequency filter device according to claim 1, wherein the impedance matching circuit is connected to a common connection point to which the radio-frequency filter circuit and another radio-frequency filter circuit are connected.

7. The radio-frequency filter device according to claim 1, wherein:
   the radio-frequency filter circuit comprises:
      a series-arm circuit on a path connected between a first input/output terminal and a second input/output terminal, and
      a parallel-arm circuit connected between a node on the path and ground,
   the parallel-arm circuit comprises:
      a first circuit including a first parallel-arm resonator, and
      a second circuit connected in parallel to the first circuit and including a second parallel-arm resonator,
   the first circuit or the second circuit further includes a series connected frequency variable circuit that includes an impedance element and the first switch connected in parallel with each other, and the second parallel-arm resonator has:
a resonant frequency different from a resonant frequency of the first parallel-arm resonator, and
an anti-resonant frequency different from an anti-resonant frequency of the first parallel-arm resonator.

8. The radio-frequency filter device according to claim 7, wherein:
the resonant frequency of the first parallel-arm resonator is lower than the resonant frequency of the second parallel-arm resonator,
the anti-resonant frequency of the first parallel-arm resonator is lower than the anti-resonant frequency of the second parallel-arm resonator,
the first circuit does not include the series connected frequency variable circuit, and
the second circuit includes the series connected frequency variable circuit.

9. The radio-frequency filter device according to claim 7, wherein:
the resonant frequency of the first parallel-arm resonator is lower than the resonant frequency of the second parallel-arm resonator,
the anti-resonant frequency of the first parallel-arm resonator is lower than the anti-resonant frequency of the second parallel-arm resonator,
the first circuit includes the series connected frequency variable circuit, and
the second circuit does not include the series connected frequency variable circuit.

10. The radio-frequency filter device according to claim 7, wherein:
the resonant frequency of the first parallel-arm resonator is lower than the resonant frequency of the second parallel-arm resonator,
the anti-resonant frequency of the first parallel-arm resonator is lower than the anti-resonant frequency of the second parallel-arm resonator, and
the first circuit and the second circuit each include the series connected frequency variable circuit.

11. The radio-frequency filter device according to claim 1, further comprising:
a series-arm circuit on a path connected between a first input/output terminal and a second input/output terminal; and
a parallel-arm circuit connected between a node on the path and ground, wherein:
the parallel-arm circuit comprises:
a parallel-arm resonator and an impedance circuit connected in series with each other,
the impedance circuit comprises:
a first impedance element, wherein the first impedance element is an inductor or a capacitor, and
a first series circuit comprising a second impedance element and the first switch connected in series with each other, wherein the second impedance element is the other of the inductor or the capacitor, and
the first series circuit is connected in parallel with the first impedance element.

12. The radio-frequency filter device according to claim 11, wherein the first impedance element is the capacitor and the second impedance element is the inductor.

13. The radio-frequency filter device according to claim 11, wherein the first impedance element is the inductor and the second impedance element is the capacitor.

14. The radio-frequency filter device according to claim 1, further comprising:
a controller configured to control the states of the first switch and the second switch.

15. A communication apparatus comprising:
a radio-frequency signal processing circuit configured to process a radio-frequency signal transmitted or received by an antenna; and
the radio-frequency filter device according to claim 14 being configured to transmit the radio-frequency signal between the antenna and the radio-frequency signal processing circuit.

* * * * *